(12) United States Patent
Ker et al.

(10) Patent No.: US 6,590,264 B2
(45) Date of Patent: Jul. 8, 2003

(54) HYBRID DIODES WITH EXCELLENT ESD PROTECTION CAPACITY

(75) Inventors: Ming-Dou Ker, Hsinchu (TW);
Che-Hao Chuang, Hsinchu (TW);
Geeng-Lih Lin, Hsinchu Hsien (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 10/180,067

(22) Filed: Jun. 27, 2002

(65) Prior Publication Data

US 2003/0075763 A1 Apr. 24, 2003

(30) Foreign Application Priority Data

Oct. 18, 2001 (TW) .................................. 90125800 A

(51) Int. Cl.[7] .............................................. H01L 23/62
(52) U.S. Cl. ........................................ 257/355; 257/360
(58) Field of Search ................................ 257/355, 360, 257/412

(56) References Cited

U.S. PATENT DOCUMENTS 5,811,857 A  9/1998 Assaderaghi et al. ......... 25/355

2002/0084490 A1 * 7/2002 Ker et al. .................. 257/355

* cited by examiner

Primary Examiner—Mark V. Prenty
(74) Attorney, Agent, or Firm—Intellectual Property Solutions, Incorporated

(57) ABSTRACT

Hybrid diodes with excellent ESD protection capacity. Each hybrid diode has two diodes: one is a poly-bounded diode formed as a junction between a substrate and a diffusion region thereon, the other is a poly diode formed as a poly gate having two regions with different conductivity. The poly-bounded diode and the poly diode are connected in series or in parallel to form a hybrid diode. The parallel hybrid diode has smaller operation resistance and as a result better ESD robustness. The series hybrid diode has lower capacitance load and is especially suitable for the ESD protection in high-speed or radio frequency integrated circuit input/output design. The hybrid diode can also be applied in the ESD protection circuit in an input/output port, a power-rail ESD clamp circuit, and a whole-chip ESD protection system. The hybrid diodes can be also implemented in the silicon-on-insulator (SOI) CMOS process.

19 Claims, 30 Drawing Sheets

US 6,590,264 B2

HYBRID DIODES WITH EXCELLENT ESD PROTECTION CAPACITY

BACKGROUND OF THE INVENTION

1. Field of the Invention

The present invention relates in general to a diode structure and its application. In particular, the present invention relates to a diode structure with electrostatic discharge (ESD) robustness.

2. Description of the Related Art

A conventional P-type diode (Dp) realized in the CMOS process with STI isolation technology is shown in FIG. 1, where a P+ diffusion 10 (as the anode) is placed in an N-well 12 to form the P-N junction of the diode. The N+ diffusion 16 in the N-well 12 acts as the cathode of the P-type diode. The P+ diffusion 10 is surrounded by a shallow trench isolation (STI) region 18 and isolated from the N+diffusion 16. In contrast, the N-type diode (Dn) realized in the CMOS process with STI technology is shown in FIG.2, where an N+ diffusion 20 (as the cathode) is placed in a P-well 22 to form the P-N junction of the diode. P+ diffusion 24 in the P-well 22 acts as the anode of such an N-type diode. There is a STI region 28 between the P+ and N+ diffusions 24 and 20 to isolate the two diffusions.

When such a P-type or N-type diode is stressed by ESD voltage in a reverse-biased condition, the P-N junction adjacent to the STI boundary is easily damaged, resulting in low ESD robustness.

To overcome the ESD vulnerable location adjacent to the STI boundary, a modified P-type diode structure is provided in U.S. Pat. No. 5,811,857 by IBM (international business machine), as shown in FIG. 3. Compared to FIG. 1, the STI regions between the P+ and N+ diffusions 30 and 36 are replaced by a poly gate 32. During P+ implantation, P+ diffusion 30 and portion 34 of the poly gate 32 are doped. During N+ implantation, N+ diffusion 36 and portion 38 of the poly gate 32 are doped. Similarly, the N-type diode structure in U.S. Pat. No. 5,811,857 is formed as shown in FIG. 4. The P-N junction of the P-type or N-type diode shown in FIG. 3 or 4 has no contact with STI boundary. Therefore, the ESD vulnerable location adjacent to STI does not appear and such modified diodes in FIGS. 3 and 4 sustain higher ESD stress compared to the traditional diode structures in FIGS. 1 and 2.

SUMMARY OF THE INVENTION

The object of the present invention is to provide hybrid diode structures and their applications on ESD protection. The hybrid diodes of the present invention have excellent ESD robustness.

According to the object, the present invention provides a hybrid diode comprising a first semiconductor layer, a gate structure, a first N-type diffusion region, a second N-type diffusion region, a first P-type diffusion region, a second P-type diffusion region, and an inter-connection. The gate structure is formed on the first semiconductor layer with a second semiconductor layer stacked on an isolating layer. The first N-type diffusion region is formed on the first semiconductor layer adjacent to the gate structure. The second N-type diffusion region is formed on the second semiconductor layer. The first and the second N-type diffusion regions are formed with the same N-type implantation. The first P-type diffusion region is formed on the first semiconductor layer adjacent to the gate structure. The second P-type diffusion region is formed on the second semiconductor layer. The first and the second P-type diffusion regions are formed with the same P-type implantation. The first N-type diffusion region and the first P-type diffusion region are respectively the cathode and anode of a first diode. The second N-type diffusion region and the second P-type diffusion region are respectively the cathode and anode of a second diode. The inter-connection connects the first and second diodes in parallel or in series to form the hybrid diodes.

The hybrid diodes of the present invention are used between two pads to provide ESD protection between the two pads. The pads can be power lines, I/O pads or a combination of the two. The hybrid diodes can be either forward-biased or reverse-biased during normal conditions. The hybrid diodes can also be used between different power lines to form ESD-connection cells, which provide electrical connection during an ESD event.

The series hybrid diodes of the present invention have smaller equivalent capacitance, and are specially designed for ESD protection of the I/O ports of radio frequency (RF) ICs. The parallel hybrid diodes of the present invention have lower operating resistance and sustain higher ESD stress.

According to the object, the present invention further provides an electrostatic discharge (ESD) protection system suitable for use in an integrated circuit (IC). The ESD protection system comprises a relatively high voltage ESD bus, a relatively low voltage ESD bus, a power rail ESD clamp bus coupled between the relatively high voltage ESD bus and the relatively low voltage ESD bus, a high voltage ESD-connection cell coupled between the relatively high voltage ESD bus and a high voltage power line, and a low voltage ESD-connection cell coupled between the relatively low voltage ESD bus and a low voltage power line. A hybrid diode is formed in at least one of the high and low voltage ESD-connection cells. The hybrid diode has the structure described hereinabove.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Structures of the hybrid diode, I/O ESD protection circuits, power-rail ESD clamp circuits and a whole-chip ESD protection network realized by the hybrid diodes of the present invention are illustrated as follows.

The Structure of the Hybrid Diode

Figure 1:
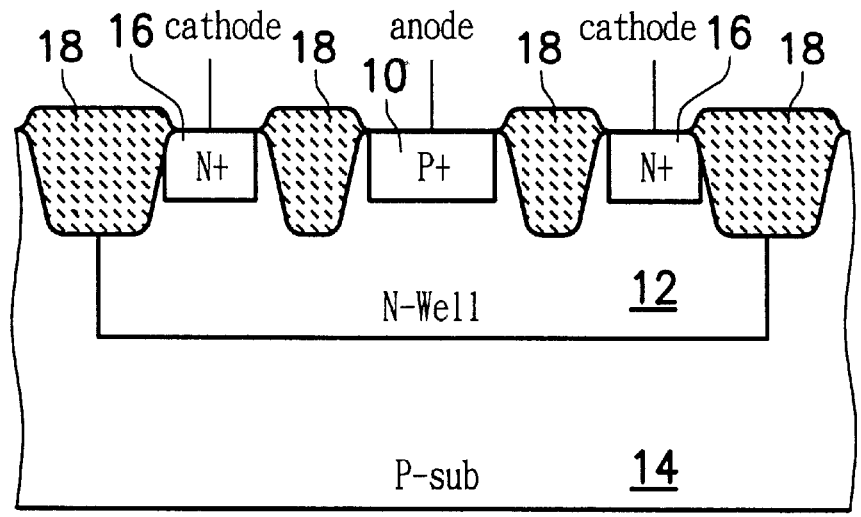
FIG. 1 shows a conventional P-type diode (Dp) realized in the CMOS process with STI isolation technology.
Figure 2:
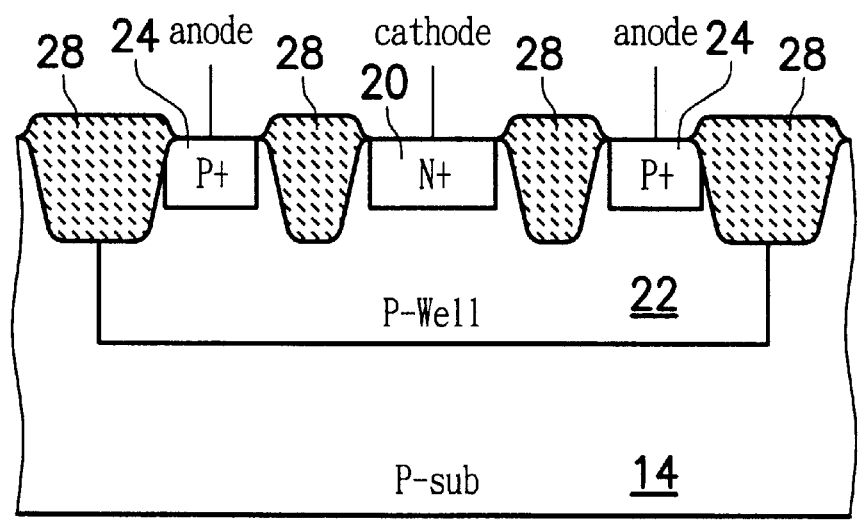
FIG. 2 shows a conventional N-type diode (Dn) realized in the CMOS process with the STI technology.
Figure 3:
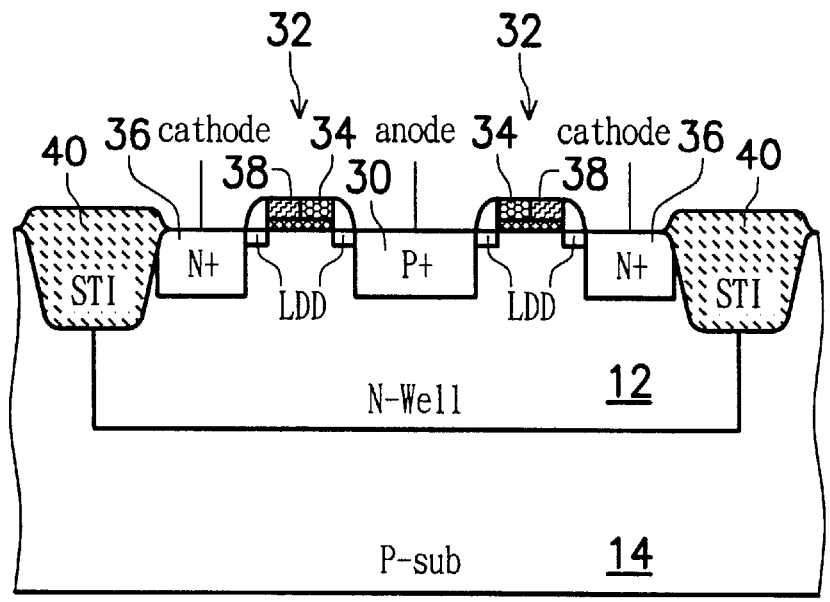
FIG. 3 shows a modified P-type diode structure provided in U.S. Pat. No. 5,811,857.
Figure 4:
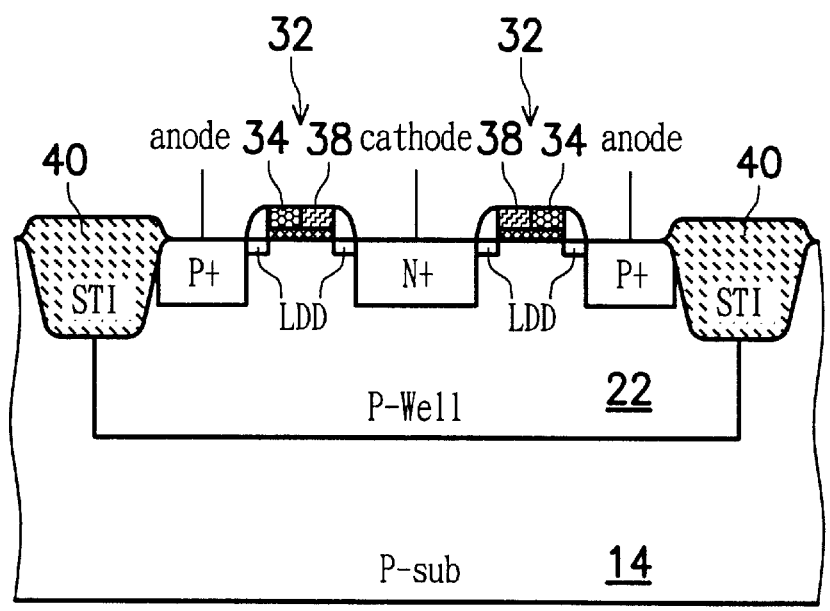
FIG. 4 shows a modified N-type diode structure provided in U.S. Pat. No. 5,811,857.
Figure 5A:
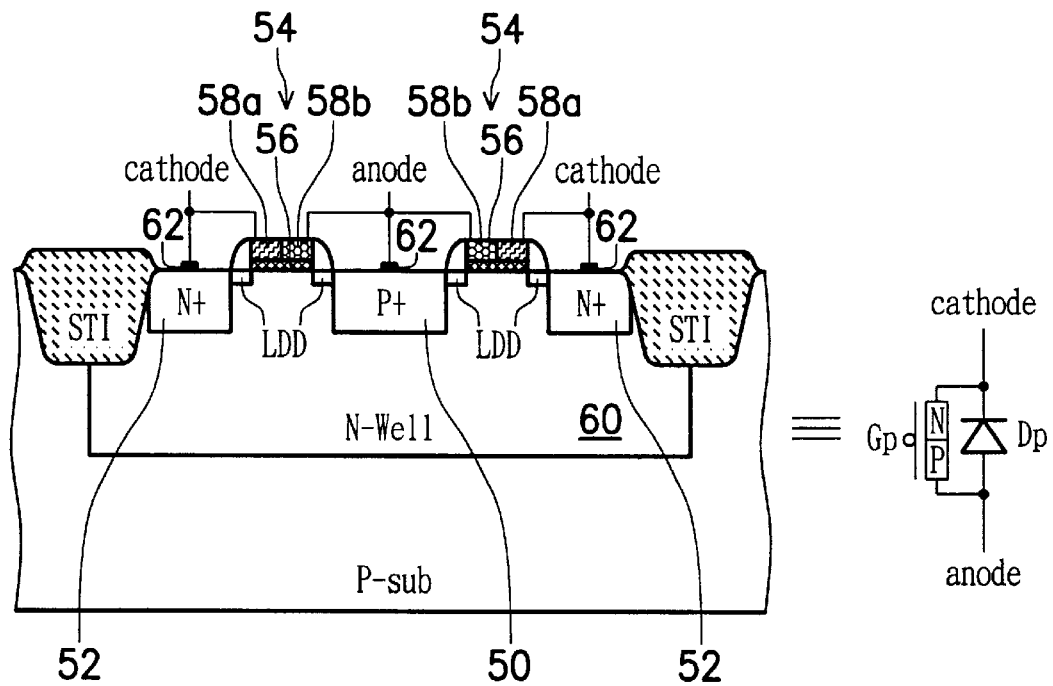
FIGS. 5a–5c show proposed P-type hybrid diodes realized by the gate oxide layer and their corresponding symbols.
Figure 5B:
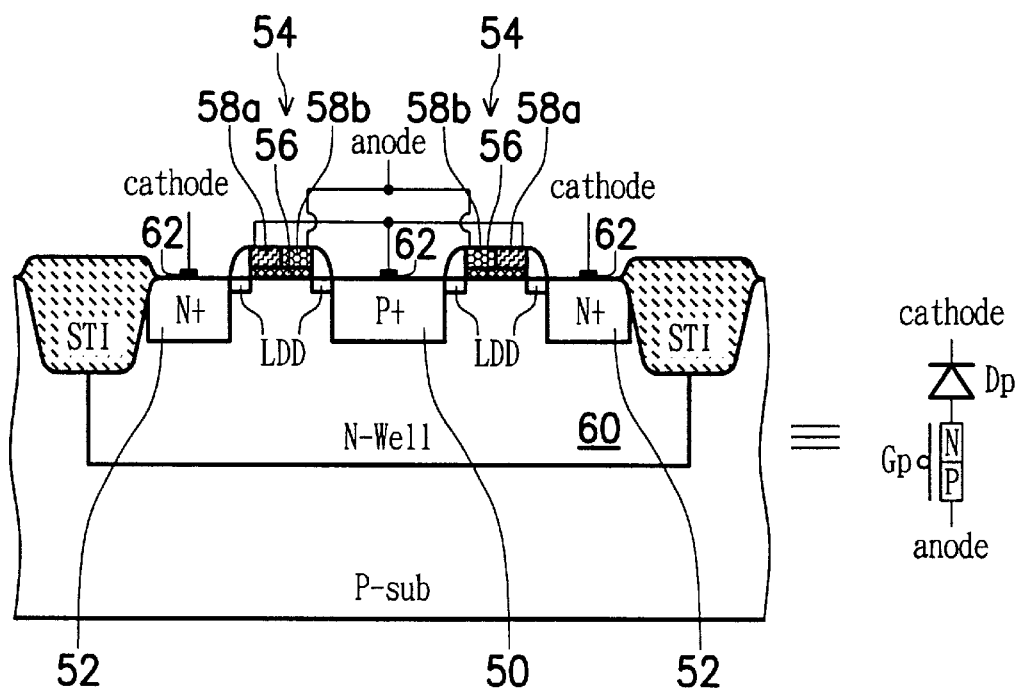
Figure 5C:
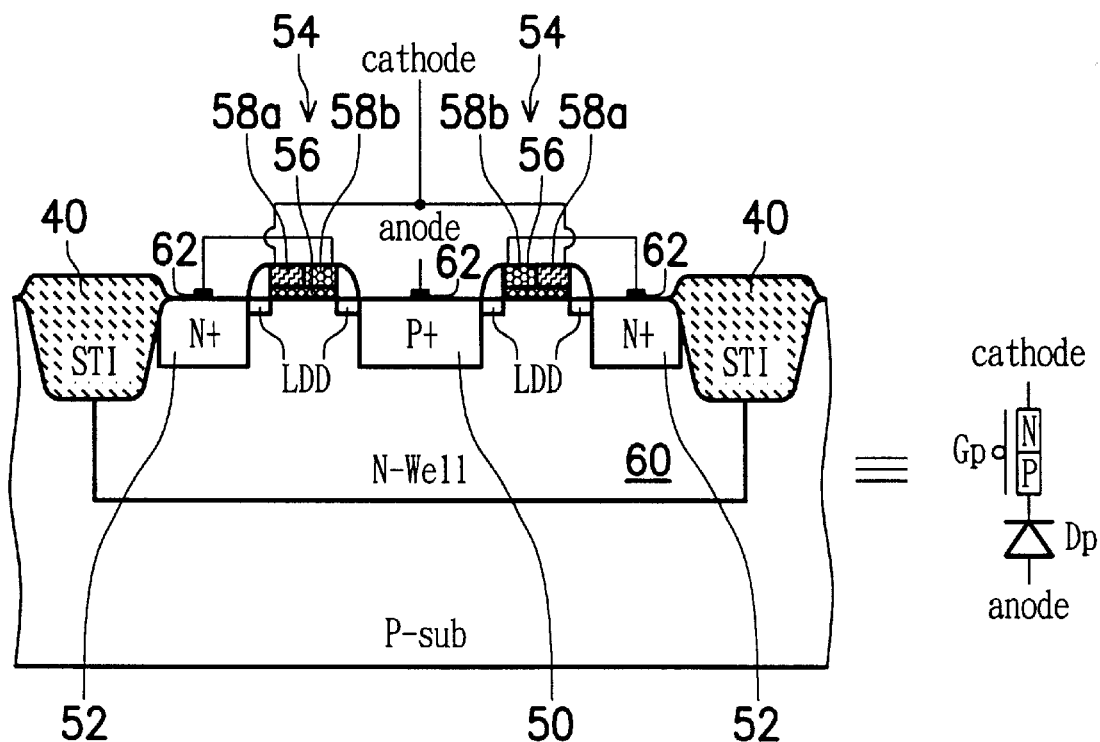

Cross sections of the proposed P-type hybrid diodes, embodied with a isolation layer of gate oxide, of the present invention and their corresponding symbols are shown in FIGS. 5a–5c. The symbols are used to draw the on-chip ESD protection circuits or systems in the following sections.

The P-type hybrid diode in FIG. 5a comprises two diodes, a poly-bounded diode Dp and a P-type poly diode Gp, connected in parallel to form a parallel P-type hybrid diode. The poly-bounded diode Dp has an anode and a cathode respectively formed by the P+ diffusion 50 and the N+ diffusion 52 in the N-well 60. The poly diode Gp is formed on the N-well 60 and is represented with the symbol Gp for its similarity to a PMOS (P-type metal on semiconductor) gate structure. The poly diode Gp comprises a polysilicon layer 58 stacked on a gate oxide layer 56. The polysilicon layer 58 close to the P+ diffusion 50 is doped by the P+ implantation forming the drains/sources of PMOS transistors in the CMOS process, as a P-type polysilicon region 58b. The polysilicon layer 58 close to the N+ diffusion 50 is doped by the N+ implantation forming the drains/sources of NMOS (N-type metal on semiconductor) transistors in the CMOS process, as an N-type polysilicon region 58a. The N+ implantation may partially overlap the P+ implantation. The N-type polysilicon region 58a and the P-type polysilicon region 58b are respectively the cathode and the anode of the poly diode Gp. The anode of the poly diode Gp is connected with the anode of the P-type poly bounded diode Dp by an inter-connection comprising contacts and metal strips to become the anode of the parallel P-type hybrid diode. The cathode of the poly diode Gp is connected with the cathode of the P-type poly bounded diode Dp to become the cathode of the parallel P-type hybrid diode. Some design rules of the CMOS process restrict the formation of the contacts 62 on the polysilicon layer in the active region. Therefore, the anode and cathode of the diode are connected out with the contacts formed on the STI region. Such a connection will be introduced in FIG. 7.

The diodes Dp and Gp of the parallel P-type hybrid diode are parallel so that the effective resistance $R_{op}$ at the operation point under ESD stress becomes smaller than the resistance of Dp or Gp working individually under ESD stress. The thermal energy generated by the ESD current, which is $I^2_{ESD} \times R_{op}$, also becomes smaller at the same ESD current because the $R_{op}$ reduced. Therefore, the P-type hybrid diode of the present invention sustains a much higher ESD stress.

The series P-type hybrid diodes formed by the P-type poly diode Gp and the poly-bounded diode Dp connected in series and the corresponding symbols are shown in FIGS. 5b and 5c. In FIG. 5b, the cathode of the P-type poly diode Gp is connected to the anode of the poly-bounded diode Dp by an inter-connection. The anode of the P-type poly diode Gp becomes the anode of the series P-type hybrid diode, and the cathode of the poly-bounded diode Dp becomes the cathode of the series P-type hybrid diode. Because the diodes Dp and the Gp of the series P-type hybrid diode are in series, the respective junction capacitances are also in series. Therefore, the resulting capacitance of the series P-type hybrid diode is much smaller than the junction capacitance of the diode Dp or Gp only. With the smaller capacitance, the series P-type hybrid diode can be used in the I/O port of high-speed or RF (radio frequency) IC applications, which needs smaller input capacitance to reduce the loading of the I/O port.

In FIG. 5c, another series P-type hybrid diode is shown. The anode of the poly-bounded diode Dp becomes the anode of the series P-type hybrid diode, and the cathode of the P-type poly diode Gp becomes the cathode of the series P-type hybrid diode. This series P-type hybrid diode can also be used in the I/O port of high-speed or RF IC applications.

Figure 6A:
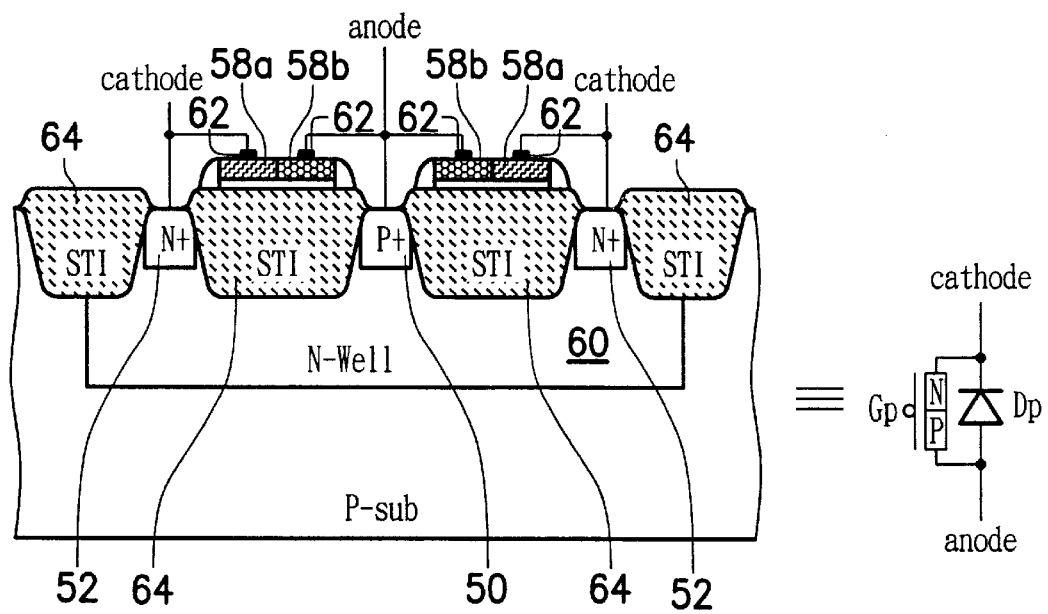
FIGS. 6a–6c show proposed P-type hybrid diodes realized by the field oxide layer and the corresponding symbols.
Figure 6B:
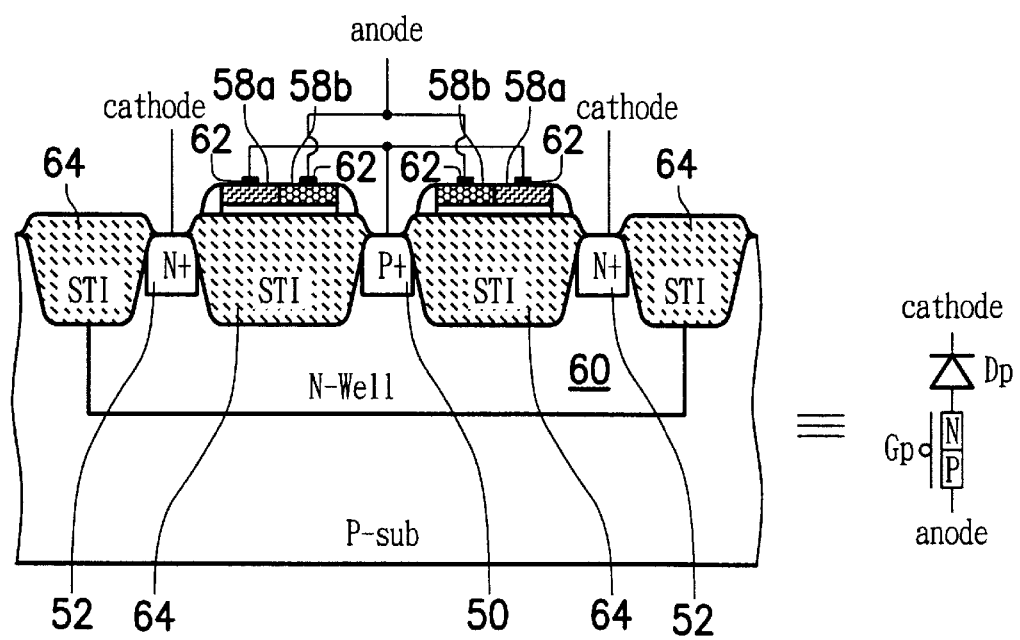
Figure 6C:
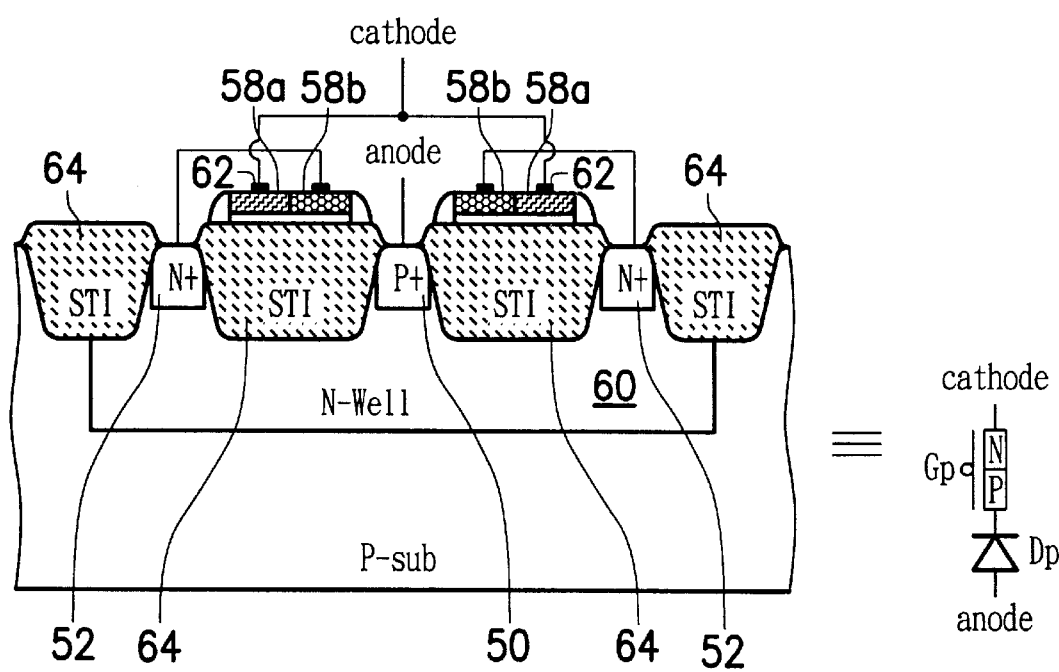

The gate oxide of the gate structures in FIGS. 5a–5c can be replaced with field oxide as the insulating layer between the P-type poly diode and the substrate. In a CMOS process, the field oxide layer can be realized with shallow trench isolation (STI) or local oxidation (LOCOS). The area having field oxide layer fabricated with STI is called a STI region. The P-type hybrid diodes realized by the field oxide layer 64 and the corresponding symbols are illustrated in FIGS. 6a–6c. Different from FIGS. 5a–5c, the contacts 62 of the inner-connection are located on the polysilicon layer 58. It is generally acceptable in CMOS process to have the contacts 62 formed on the field oxide layer 64 above the polysilicon layer 58.

Figure 7:
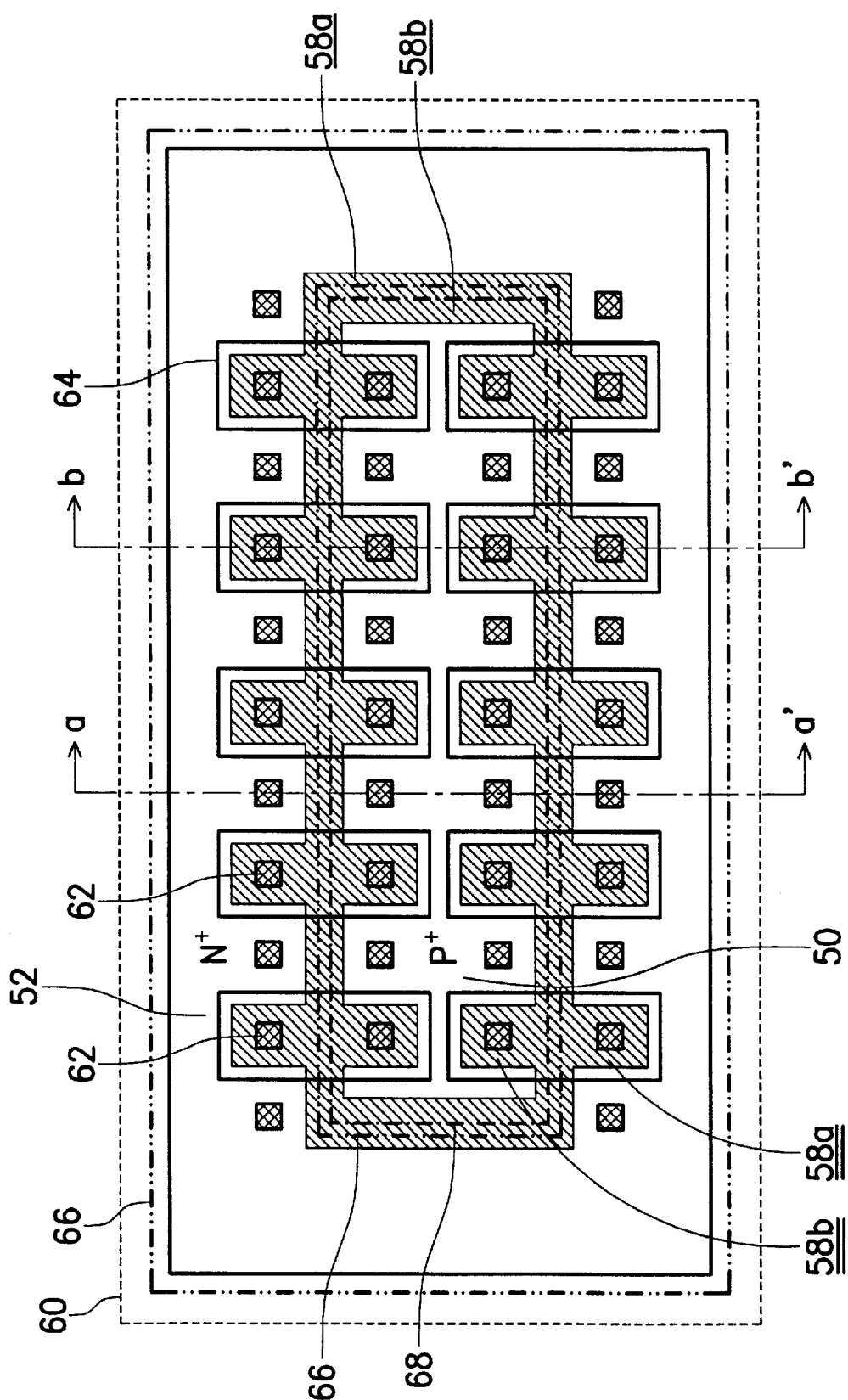
FIG. 7 shows a layout of a P-type hybrid diode of the present invention.

FIG. 7 shows a layout of a P-type hybrid diode of the present invention. The three outer rings are respectively defined as boundaries for an N-well 60, an N+ implantation 66 and a field oxide layer 64. The region with slashed lines defines the polysilicon layer 58. Part of the polysilicon layer 58 is formed on the field oxide layer 64, while the remaining part, though not formed on the field oxide layer 64, is provided with a gate oxide layer to isolate from the N-well 60 beneath. The P+ implantation 68 defines the P+ diffusion 50 and the P-type polysilicon region 58b. The N+ implantation 66 defines the N+ diffusion 52 and the N-type polysilicon region 58a. Although the N+ implantation is distanced from the P+ implantation in FIG. 7, they can partially overlap on the polysilicon layer 58. The contacts 62 are formed on the P+ diffusion 50, the N+ diffusion 52 or the polysilicon layer 58 on the field oxide layer. The inner-connection (not shown) is then applied to connect the P-type poly diode and the poly-bounded diode in parallel or in series. FIGS. 5a–5c show the cross section along the dotted line aa', and FIGS. 6a–6c show the cross section along the dotted line bb'.

Figure 8A:
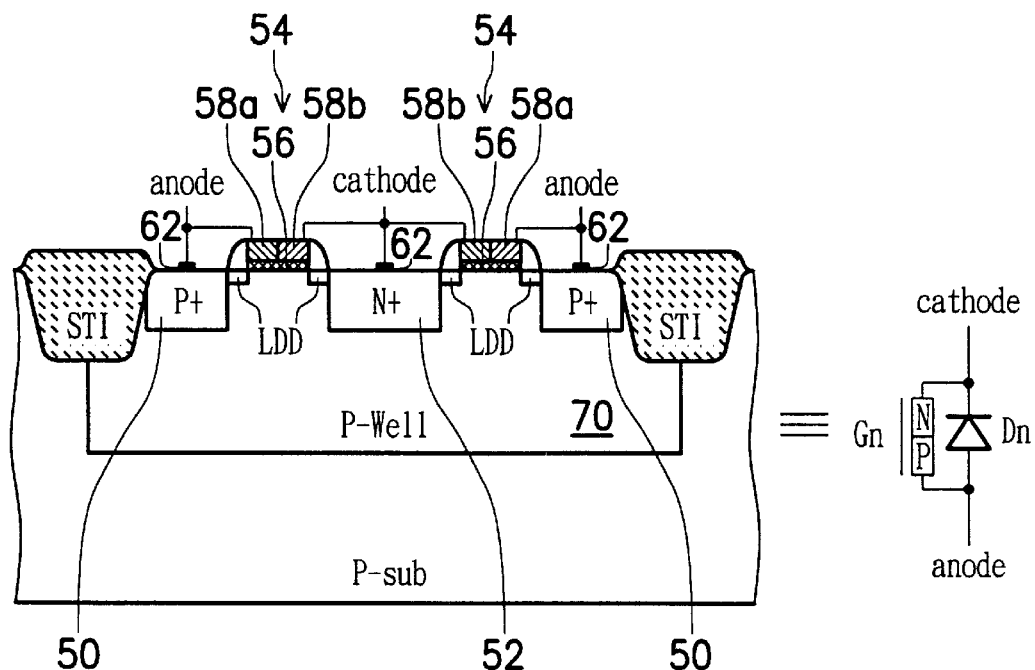
FIGS. 8a–8c illustrate proposed N-type hybrid diodes realized by the gate oxide layer and their corresponding symbols.
Figure 8B:
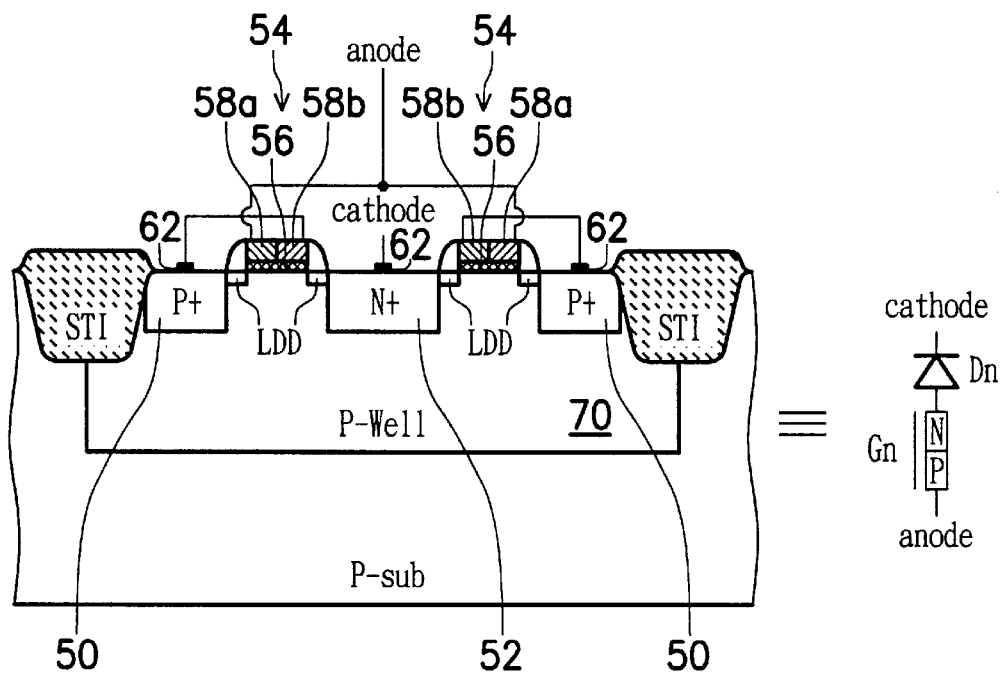
Figure 8C:
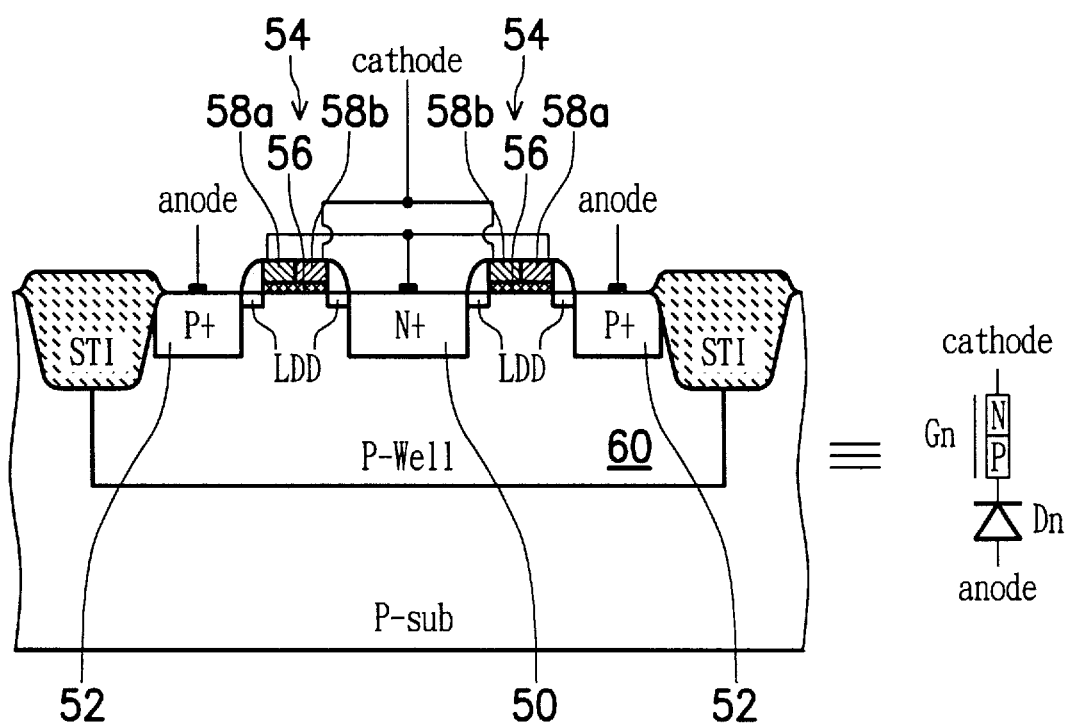

Similarly, the cross section of an N-type hybrid diode structure of the present invention realized by a gate oxide layer and this corresponding symbol are shown in FIGS. 8a–8c. The symbols are used to draw the on-chip ESD protection circuit in the next section.

The N-type hybrid diode in FIG. 8a comprises two diodes, a poly-bounded diode Dn and an N-type poly diode Gn, connected in parallel to form a parallel N-type hybrid diode. The poly-bounded diode Dn has an anode and a cathode respectively formed by the P+ diffusion 50 and the N+ diffusion 52 in the P-well 70. The N-type poly diode Gn is formed on the P-well 70 and is represented by the symbol Gn for its similarity to an NMOS gate structure. The N-type poly diode Gn comprises a polysilicon layer 58 stacked on a gate oxide layer 56. The polysilicon layer 58 close to the P+ diffusion 50 is doped by the P+ implantation forming the drain/source in the CMOS process, as a P-type polysilicon region 58b. The polysilicon layer 58 close to the N+ diffusion 52 is doped by the N+ implantation forming the drain/source in the CMOS process, as an N-type polysilicon region 58a. The N+ implantation can partially overlap the P+ implantation. The N-type polysilicon region 58a and the P-type polysilicon region 58b are respectively the cathode and the anode of the poly diode Gp. The anode of the poly diode Gn is connected with the anode of the N-type poly bounded diode Dn by an inter-connection comprising contacts and metal strips to become anode of the parallel N-type hybrid diode. The cathode of the P-type poly diode Gn is connected with the cathode of the poly bounded diode Dn to become the cathode of the parallel N-type hybrid diode.

The series N-type hybrid diodes formed by the N-type poly diode Gn and the poly-bounded diode Dn connected in series and the corresponding symbols are shown in FIGS. 8b and 8c. In FIG. 8b, the anode of the N-type poly diode Gn becomes the anode of the series N-type hybrid diode, and the cathode of the poly-bounded diode Dn becomes the cathode of the series N-type hybrid diode. In FIG. 8c, the anode of the poly-bounded diode Dn becomes the anode of the series N-type hybrid diode, and the cathode of the N-type poly diode Gn becomes the cathode of the series N-type hybrid diode.

Figure 9A:
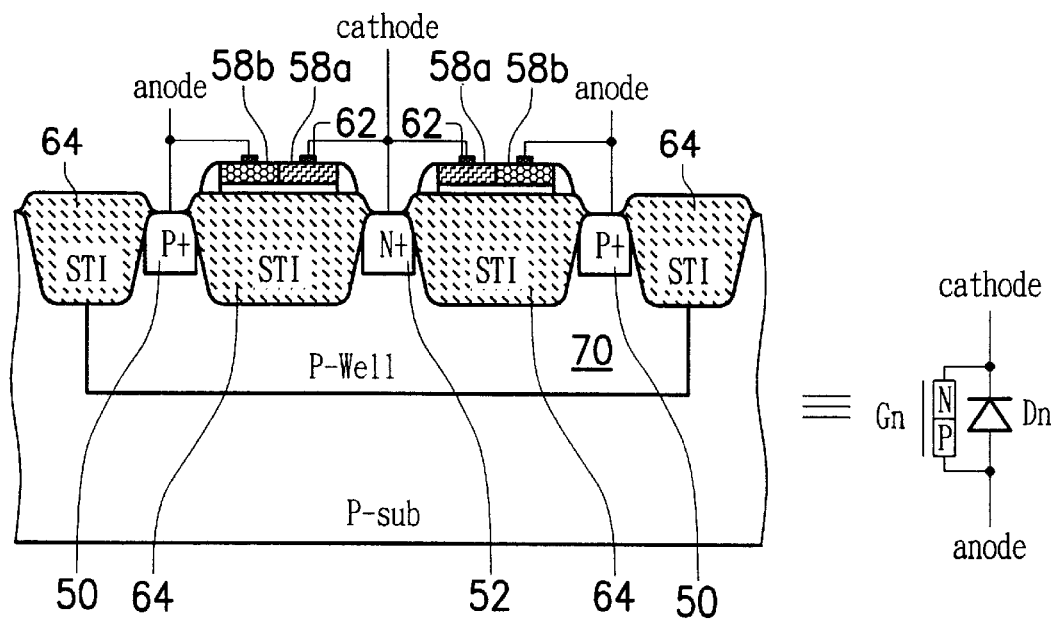
FIGS. 9a–9c show proposed N-type hybrid diodes realized by the field oxide layer and the corresponding symbols.
Figure 9B:
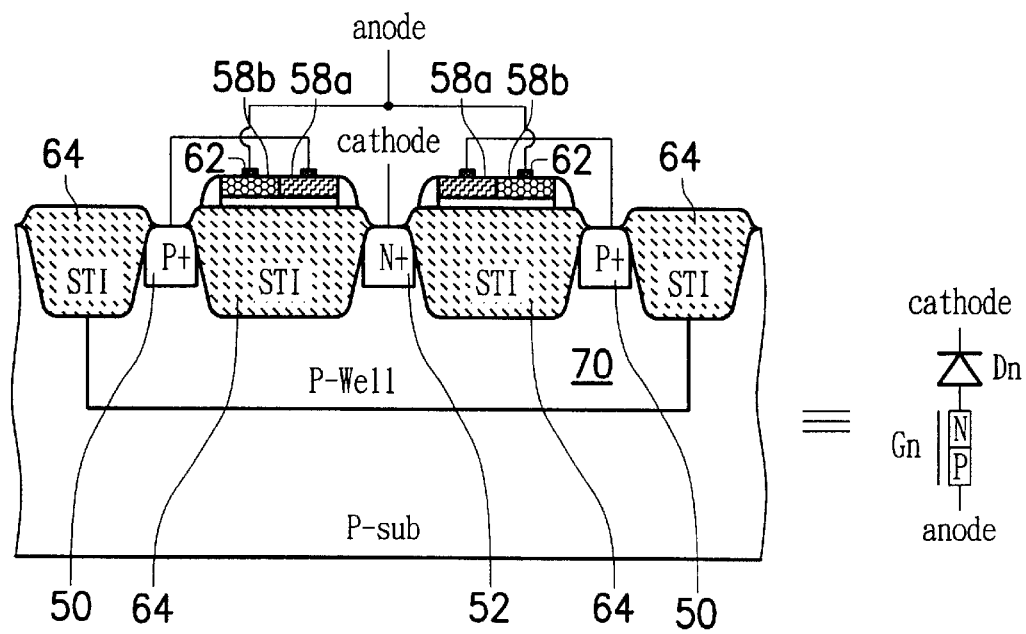
Figure 9C:
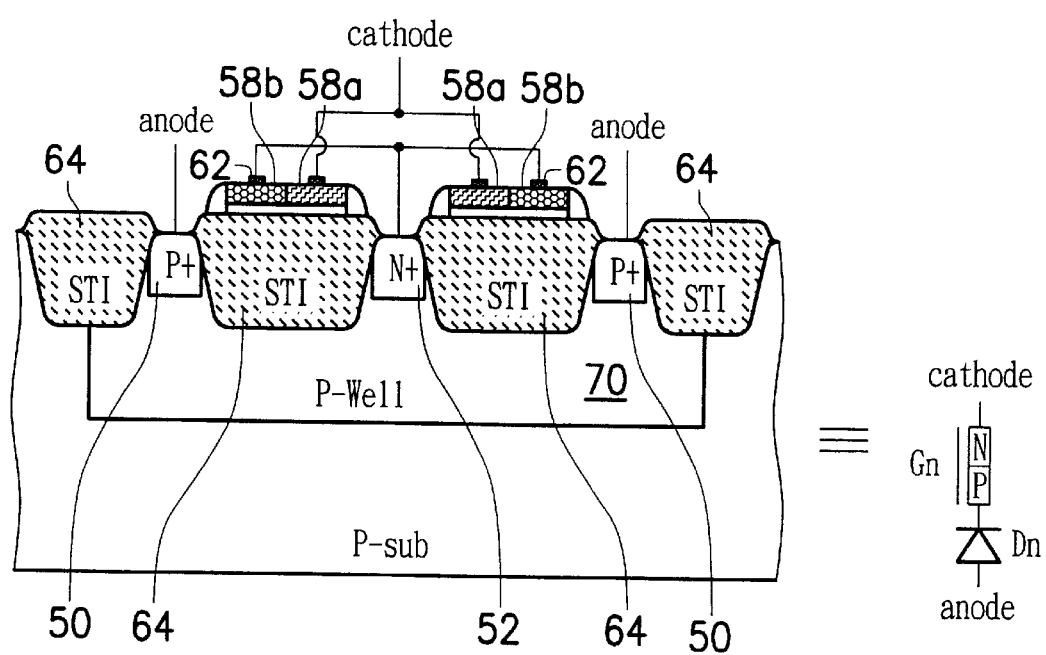

The N-type hybrid diodes in FIGS. 8a–8c realized by the field oxide layer 64 as the insulating layer between the N-type poly diode and the substrate and the corresponding symbols are illustrated in FIGS. 9a–9c.

Figure 10:
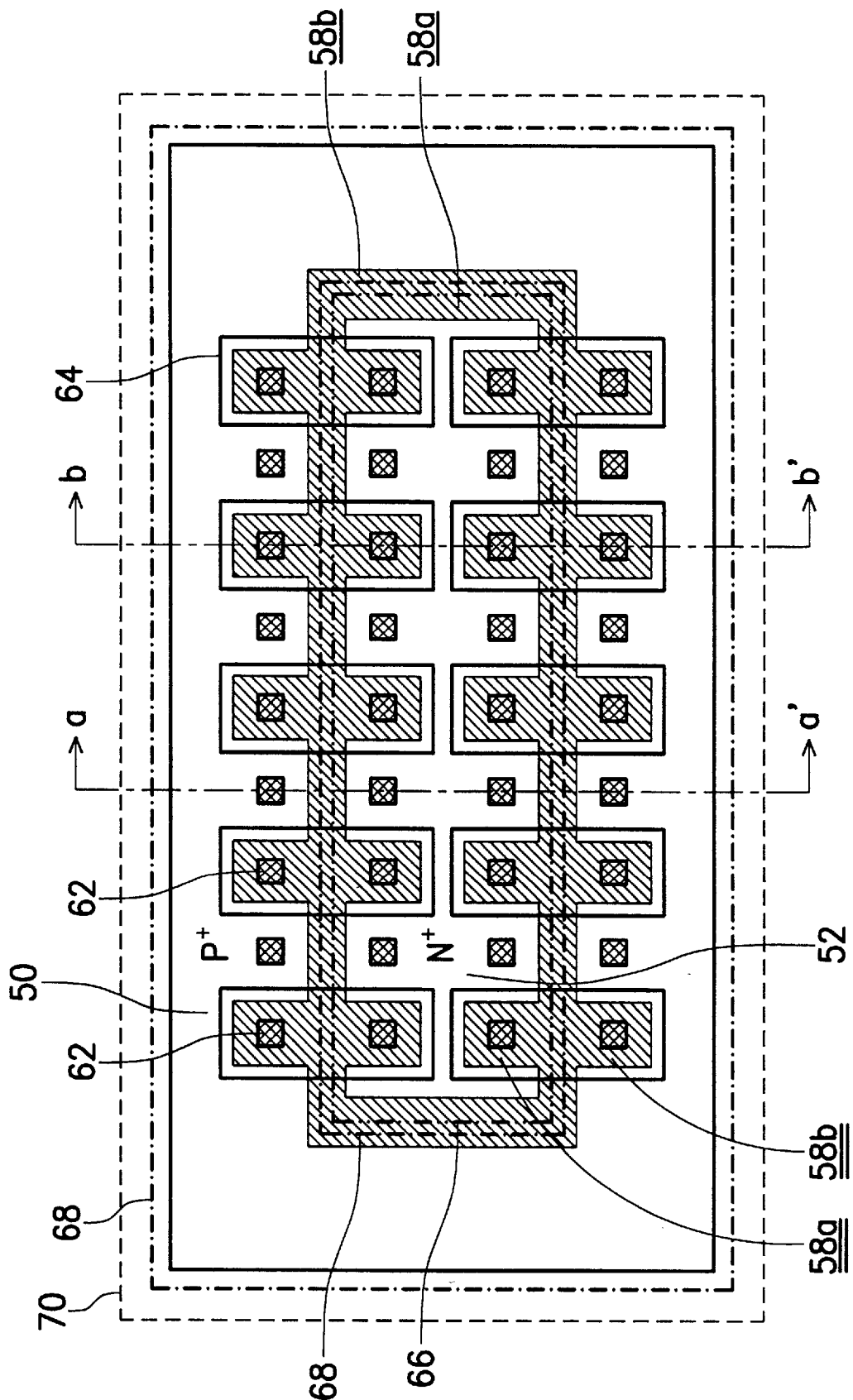
FIG. 10 shows a layout of a N-type hybrid diode of the present invention.

FIG. 10 shows a layout of the N-type hybrid diodes of the present invention in FIGS. 9a–9c and FIGS. 8a–8c. The N-type hybrid diode is formed in a P-well 70. The N+ implantation 66 defines the N+ diffusion 52 and the N-type polysilicon region 58a. The P+ implantation 68 defines the P+ diffusion 50 and the P-type polysilicon region 58b.

In some advanced CMOS process, there is an additional ESD implantation to cover the LDD (lightly doped drain) structure in the ESD protection component. The ESD implantation makes a DDD structure formed in a drain region to improve ESD robustness of the ESD protection component. Such an additional ESD implantation can also be used on the proposed N-type or P-type hybrid diodes to cover the LDD structure in FIGS. 5a–5c, FIGS. 6a–6c, FIGS. 8a–8c, and FIGS. 9a–9c.

In some advanced CMOS process, there can yet be another ESD implantation to reinforce the implantation dosage and lower the reverse-bias breakdown voltage of the P-N junction. Thus, the ESD protection component is activated much faster during an ESD event. Such an ESD implantation can also be applied in the hybrid diode in the present invention to decrease the reverse-bias breakdown voltage of the P-type diode in FIGS. 5a–5c, FIGS. 6a–6c, or of the N-type diode in FIGS. 8a–8c and FIGS. 9a–9c.

Although, the hybrid diodes are demonstrated on the general CMOS process, the proposed hybrid diodes can be also implemented on the SOI (Silicon On Insulator) process.

ESD Protection Circuits for I/O Pad

Figure 11B:
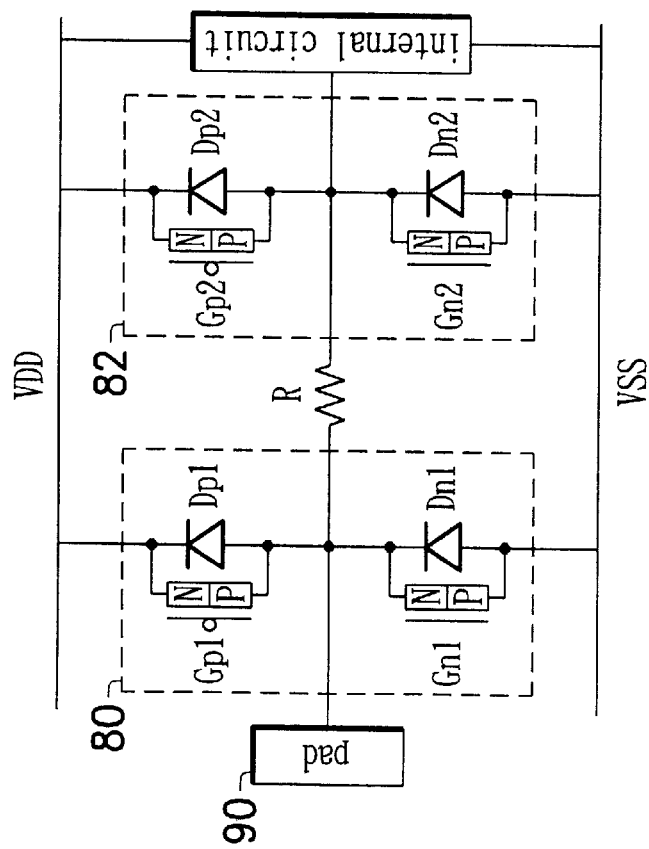
FIGS. 11a–11d show ESD protection circuits with the hybrid diodes of the present invention for the input/output (I/O) pads.
Figure 11A:
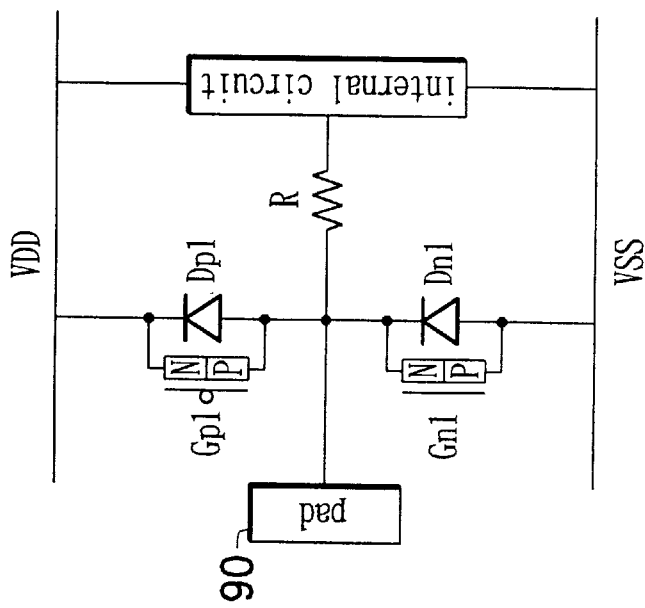
Figure 11D:
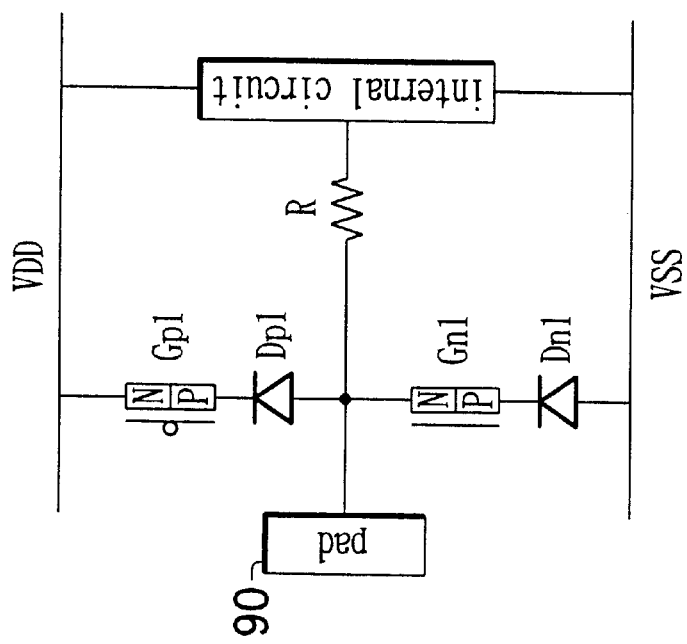
Figure 11C:
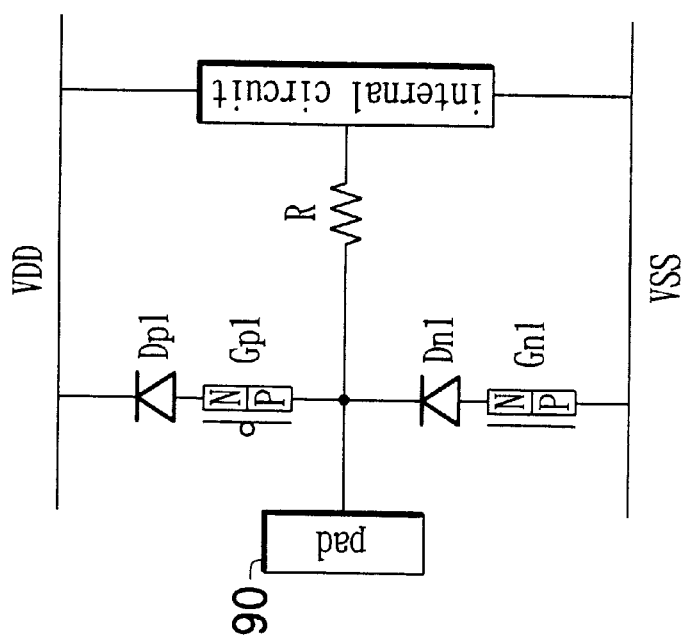

The ESD protection circuits with the hybrid diodes of the present invention for the input/output (I/O) pads are shown in FIGS. 11a–11d. In FIG. 11a, a parallel N-type hybrid diode is used to clamp the stress between the I/O pad 90 and VSS, and a parallel P-type hybrid diode is used to clamp the stress between the I/O pad 90 and VDD. In FIG. 11b, a primary ESD protection circuit 80 is composed of a parallel P-type hybrid diode and a parallel N-type hybrid diode. So is the secondary ESD protection circuit 82. As mentioned before that a parallel hybrid diode has a less resistance at operating point, the ESD protection circuit with parallel hybrid diodes shown in FIG. 11a or 11b has higher ESD robustness. The parallel P-type and N-type hybrid diodes in FIG. 11a are replaced by the series P-type and N-type hybrid diodes in FIGS. 11c and 11d, where the series P-type hybrid diodes are used to clamp stress between the I/O pad 90 and VDD, and the series N-type hybrid diodes are used to clamp the stress between the I/O pad 90 and VSS. The series hybrid diodes with smaller capacitance loadings provide optimum ESD protection without overload on the I/O port, therefore, specially suitable for using in the I/O port of a high-speed or RF IC.

Power-rail ESD Clamp Circuits

Figure 12C:
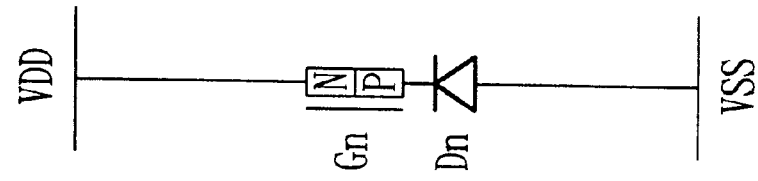
FIGS. 12a–12c show power-rail clamp circuits realized with the parallel or series N-type hybrid diodes of the present invention, where all the hybrid diodes are reverse biased during normal conditions.
Figure 12B:
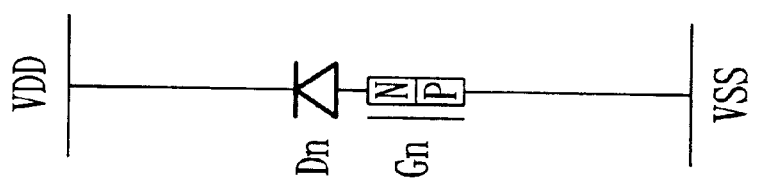
Figure 12A:
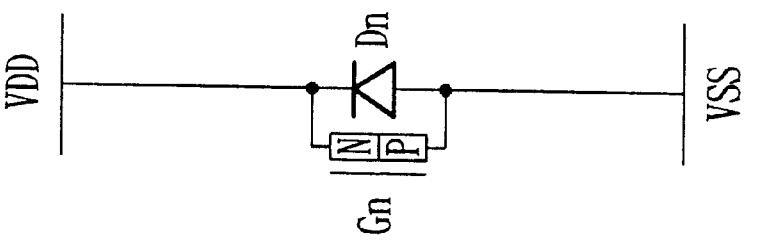
Figure 13C:
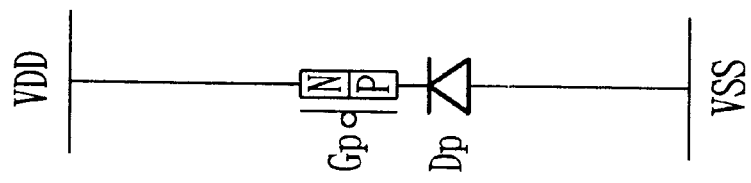
FIGS. 13a–13c show power-rail clamp circuits realized with the parallel or series P-type hybrid diodes of the present invention, where all the hybrid diodes are reverse biased during normal conditions.
Figure 13B:
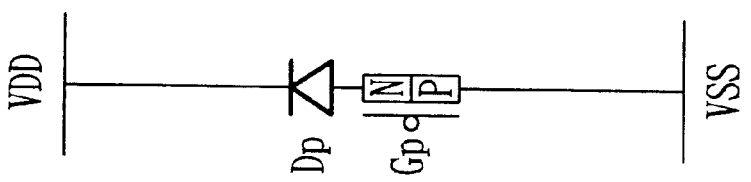
Figure 13A:
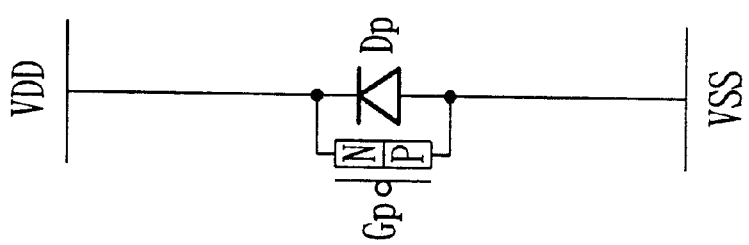

The power-rail (VDD-to-VSS) clamp circuits realized with the parallel or series N-type hybrid diodes of the present invention are shown in FIGS. 12a–12c, where all the hybrid diodes are reverse biased during normal conditions. In FIG. 12a, a reverse biased parallel N-type hybrid diode is used. In FIGS. 12b and 12c, two types of reverse biased series N-type hybrid diodes are respectively used as the ESD clamp component. In normal IC operation condition, the voltage across VDD and VSS is lower than the junction breakdown voltage of the diode and the diode is kept off. During an ESD event, the surging voltage between VDD and VSS is higher than the junction breakdown voltage and the diode breaks down to bypass the ESD current. Similar designs in power-rail ESD clamp circuit but realized with the P-type hybrid diodes are shown in FIGS. 13a–13c.

Figure 14C:
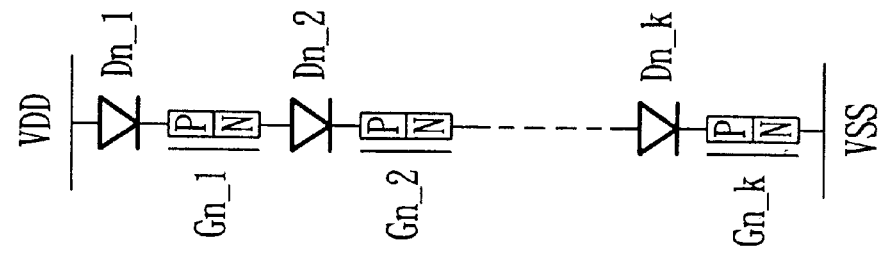
FIGS. 14a–14c and 15a–15c show power-rail ESD clamp circuits with stacked diodes forward biased during normal conditions.
Figure 14B:
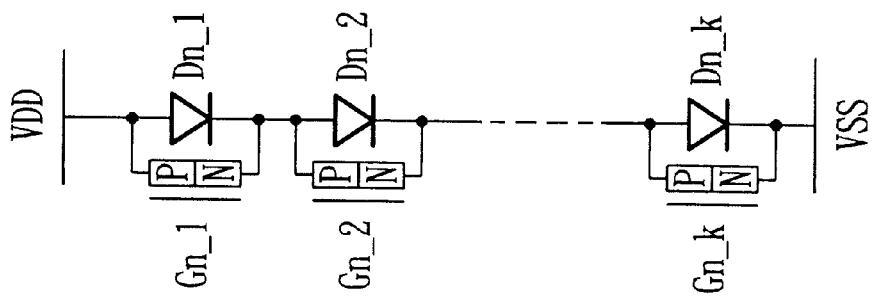
Figure 14A:
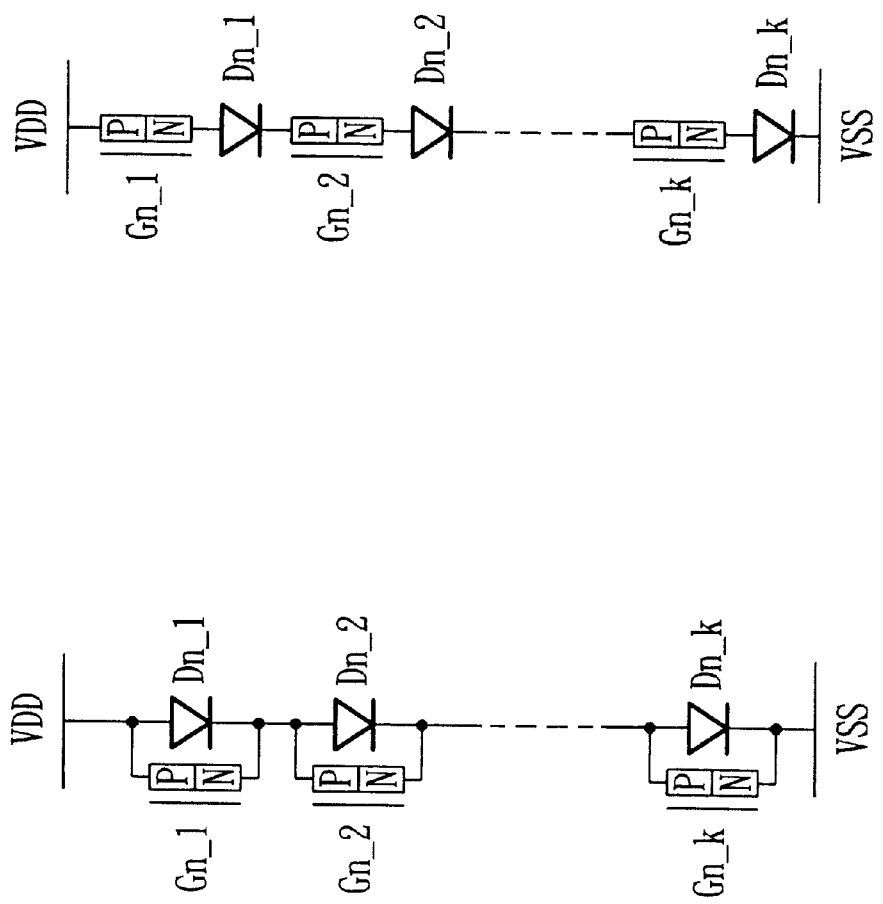
Figure 15C:
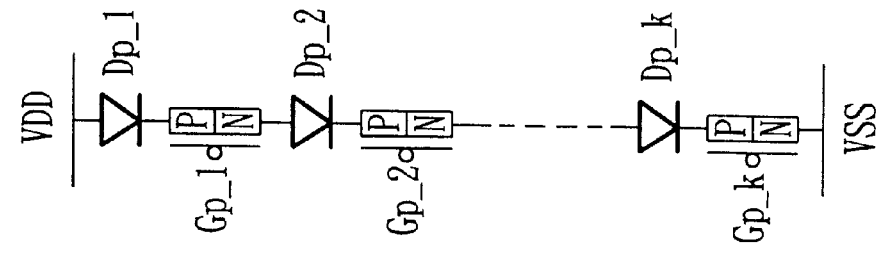
Figure 15B:
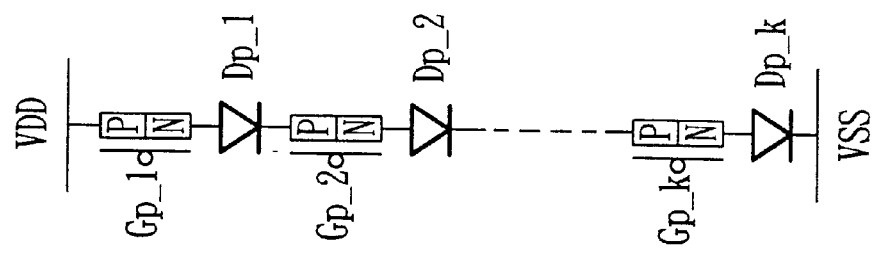
Figure 15A:
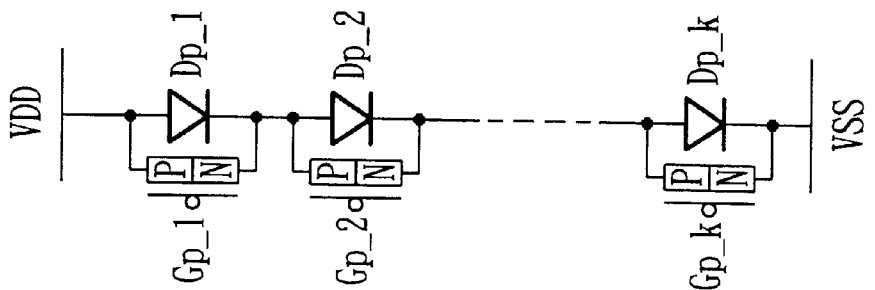

Other designs of the power-rail ESD clamp circuit with stacked diodes are shown in FIGS. 14a–14c and 15a–15c. FIGS. 14a–14c show the power-rail ESD clamp circuits realized with the parallel or series N-type hybrid diodes, where all hybrid diodes are forward biased during normal conditions. During normal conditions, the voltage across VDD and VSS is not large enough to turn on the N-type or P-type hybrid diodes. In FIG. 14a, a number of parallel N-type hybrid diodes are used. In FIGS. 14b and 14c, a number of series N-type hybrid diodes are used to clamp the stress between VDD and VSS. The hybrid diodes connected in series have an effective turn-on voltage $V_{on}$, which is equal to the sum of all the threshold voltages of the hybrid diodes connected in series. When the stress between VDD and VSS becomes higher than $V_{on}$, such as in an ESD event, all the N-type hybrid diodes are forward-biased to discharge the ESD current. The number of the stacked hybrid diodes is determined by the voltage difference between the separated power lines (VDD1 and VDD2 or VSS1 and VSS2) or the noise margin. To block a higher noise level, or to sustain a higher voltage difference between the separated power lines, more hybrid diodes must be added into the stacked configuration. Applying the similar theory, FIGS. 15a–15c are three power-rail ESD clamp circuits realized by P-type hybrid diodes according to this invention. Furthermore, N-type and P-type hybrid diodes can be alternatively employed and connected to form a power-rail ESD clamp circuit similar to those in FIGS. 14a–14c and 15a–15c.

Whole-chip ESD Protection Network

In very large scaled integrated circuit (VLSI), different circuit groups usually use different power lines to prevent noise migrating and interfering from a common power line. However, the separation of power lines, when incurring an ESD event, usually causes unexpected ESD damage at the interface circuit between different circuit groups. As a result, an ESD-connection cell should additionally be placed between the separated power lines to achieve whole-chip ESD protection. The ESD-connection cell electrically connects power lines during an ESD event, but electrically separates the power lines during normal operations.

Figure 16A:
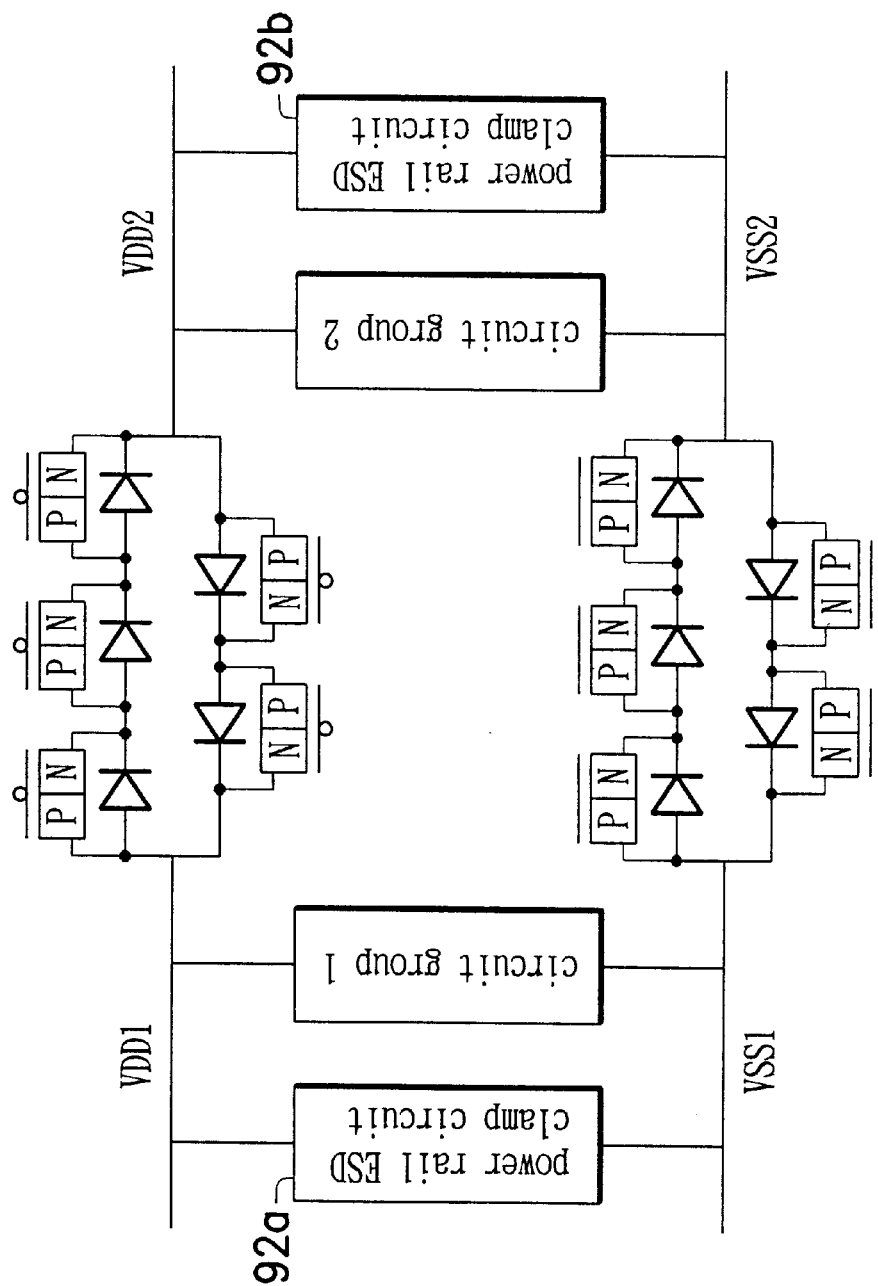
FIGS. 16a–16c and 17a–17c show ESD protection cells located between two different circuit groups.
Figure 16B:
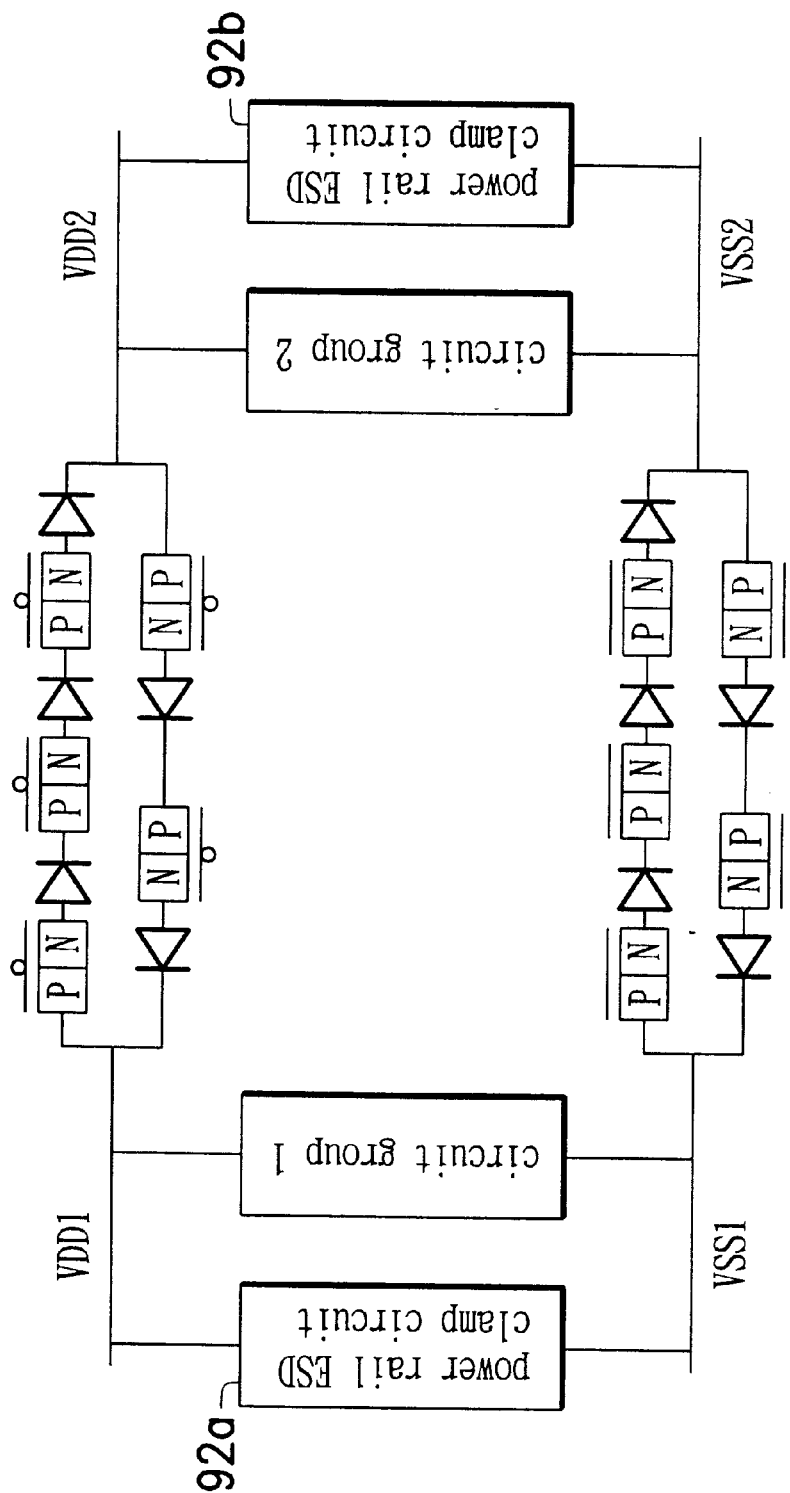
Figure 16C:
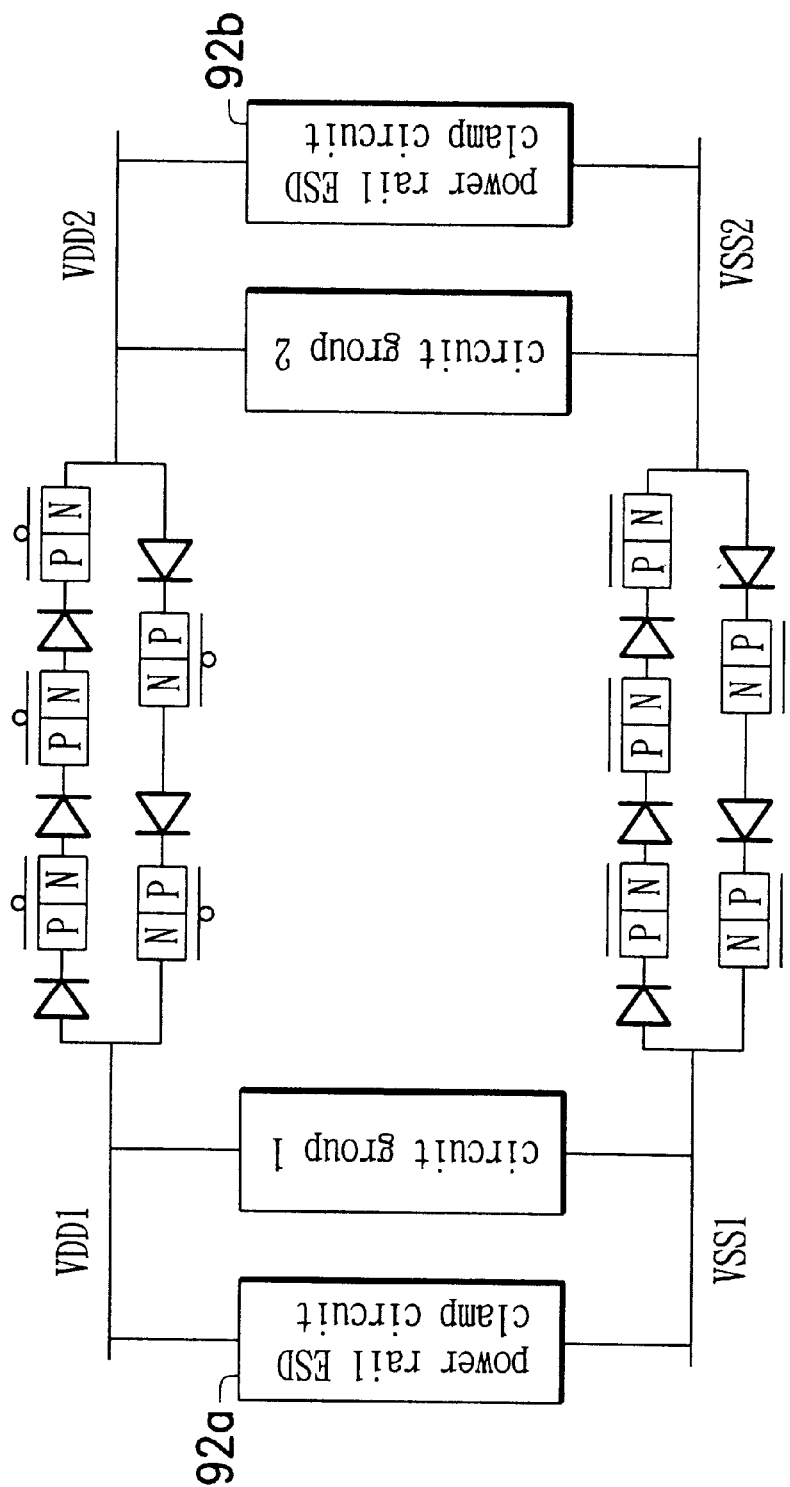
Figure 17A:
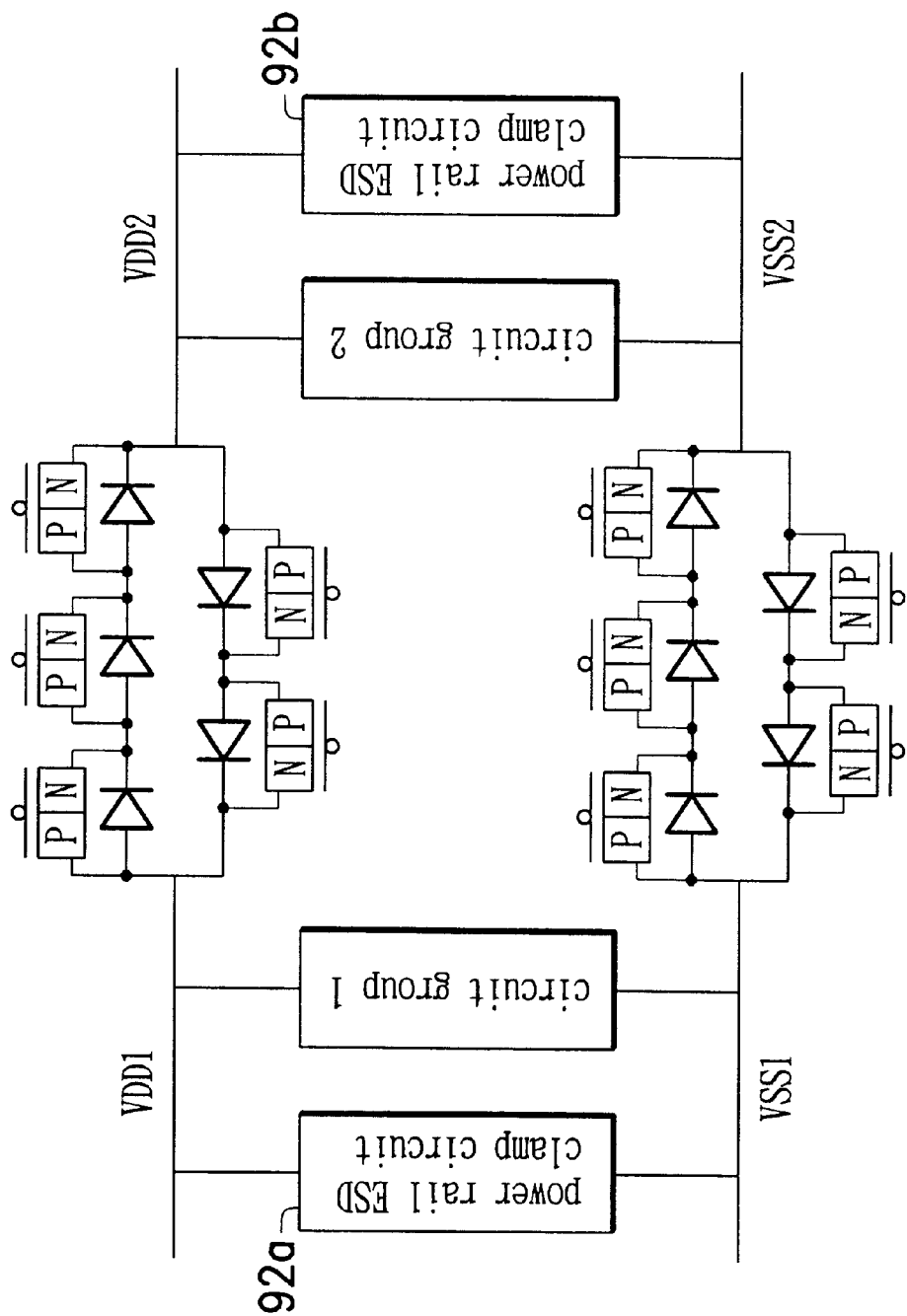
Figure 17B:
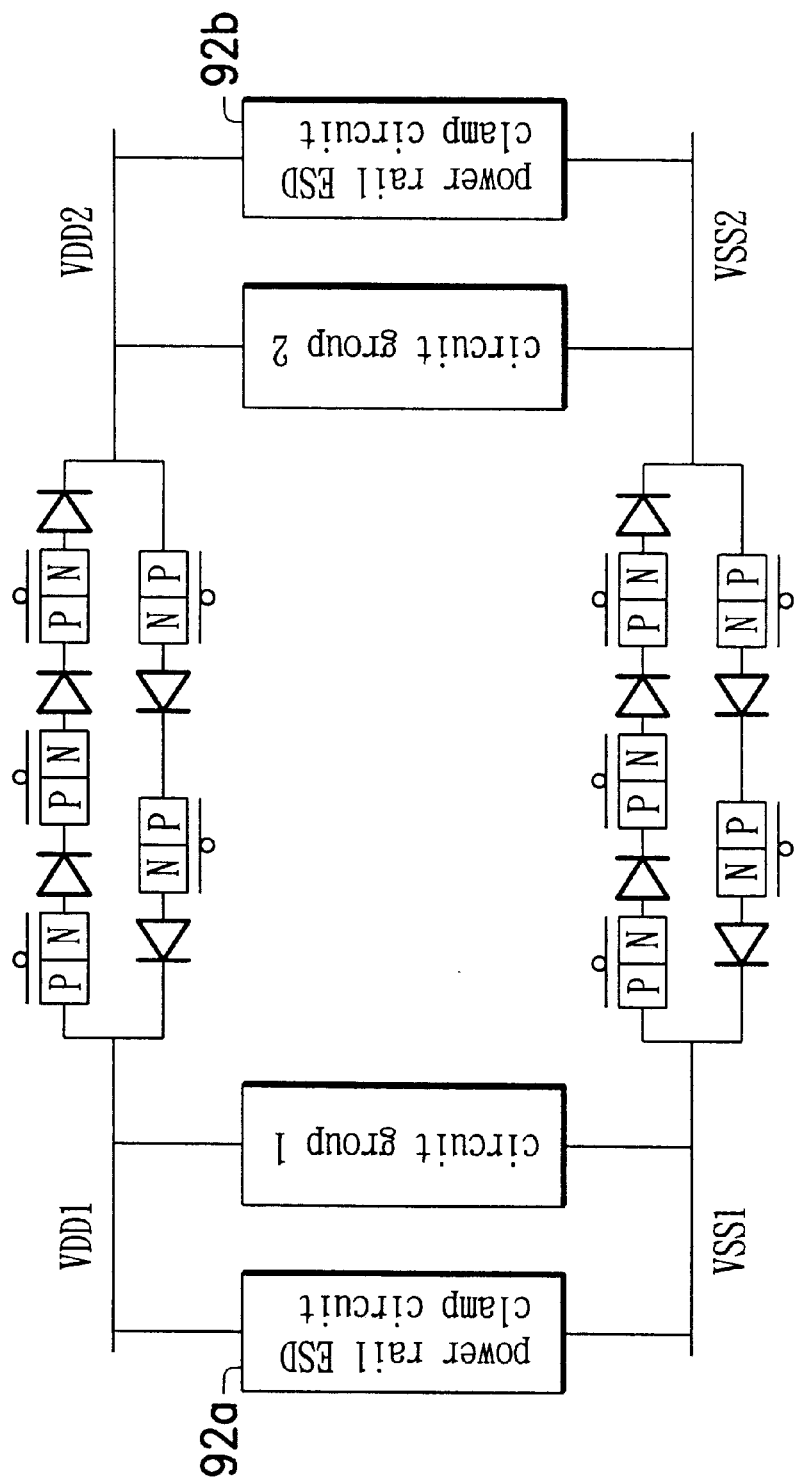
Figure 17C:
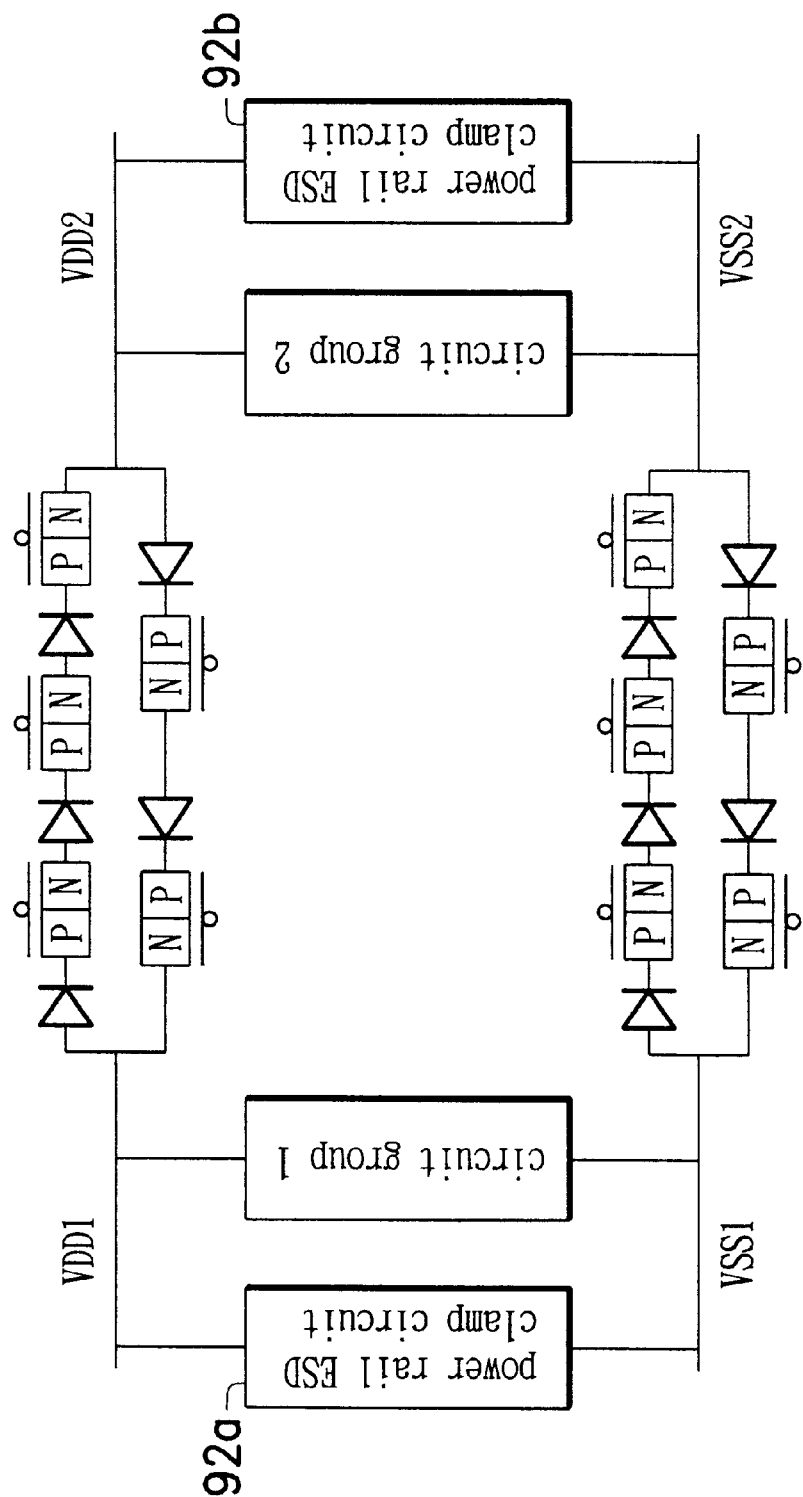

The N-type or P-type hybrid diodes according to the present invention can also be employed to achieve the whole-chip ESD protection, as shown in FIGS. 16a–16c and FIGS. 17a–17c. In these figures, VDD1 and VDD2 represent two separated VDD power lines, and VSS1 and VSS2 represent two separated VSS power lines. To provide an ESD current path between power lines, P-type or N-type hybrid diodes are stacked therebetween. The number of the diodes stacked therebetween is decided by the acceptable noise margin or the voltage difference between the power lines. The more noise margin or voltage difference is required, the more diodes must be stacked. In FIGS. 16a–16c, the ESD-connection cells between the VDD power lines are realized with the P-type hybrid diodes and the ESD-connection cells between the VSS power lines are realized with the N-type hybrid diodes of the present invention. The parallel hybrid diodes are used in FIG. 16a and the series hybrid diodes are used in FIGS. 16b and 16c. The numbers of the stacked hybrid diodes in FIG. 16 can be modified for different applications. Some modified designs with the parallel and the series P-type hybrid diodes for connecting the separated power lines are shown in FIGS. 17a–17c. The mixture of the P-type and the N-type hybrid diodes of the present invention can also be used in an ESD-connection cell.

The ESD current path provided by the back-to-back stacked hybrid diodes between the separated power lines prevents the unexpected ESD damage in the whole-chip ESD protection systems. As an example, the ESD current path in FIG. 16a is illustrated. If a positive ESD stress pulses at VDD2 when VSS1 is grounded, there are two possible ESD current paths. The ESD current can be discharged from VDD2, VDD1, then to the grounded VSS1, sequentially through the ESD-connection cell and the power-rail ESD clamp circuit 92a. The ESD current can also be discharged from VDD2, VSS2, then to the grounded VSS1, sequentially through the power rail-ESD clamp circuit 92b and the ESD-connection cell. The current path with the smallest triggered voltage is the one that the current discharge actually takes place.

Figure 18A:
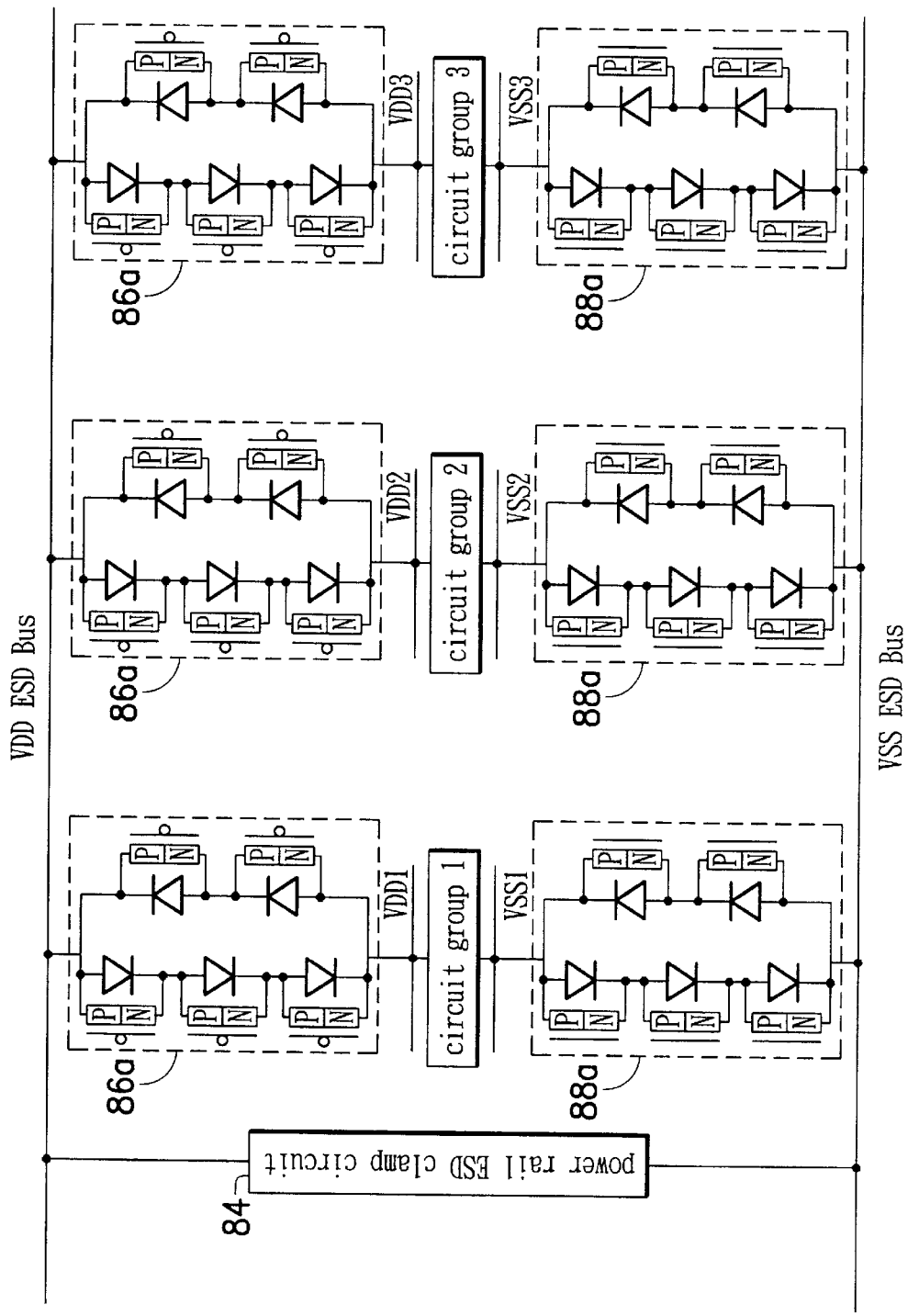
FIGS. 18a–18c and 19a–19c show whole-chip ESD protection networks utilizing the hybrid diodes according to the invention.
Figure 18B:
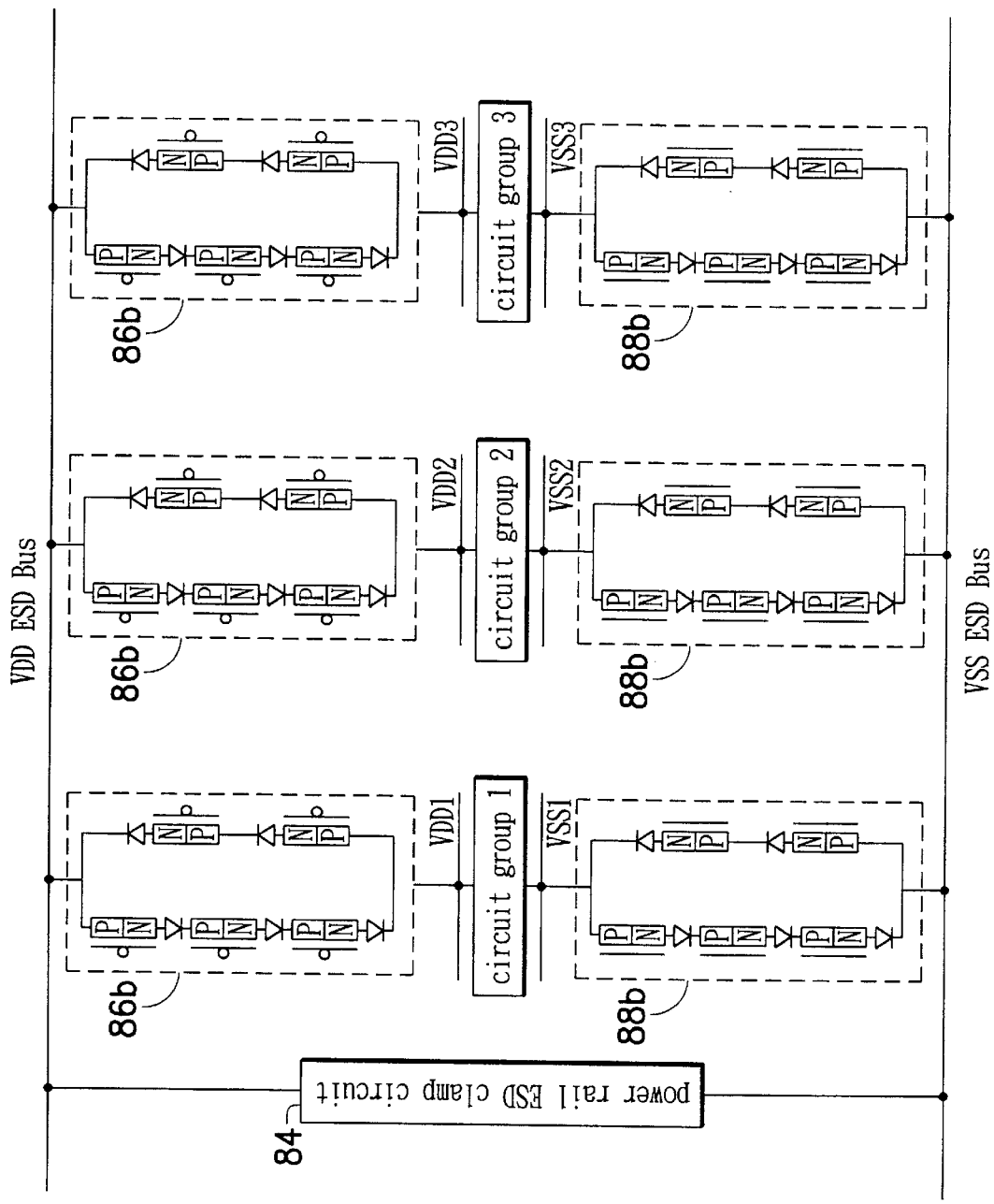
Figure 18C:
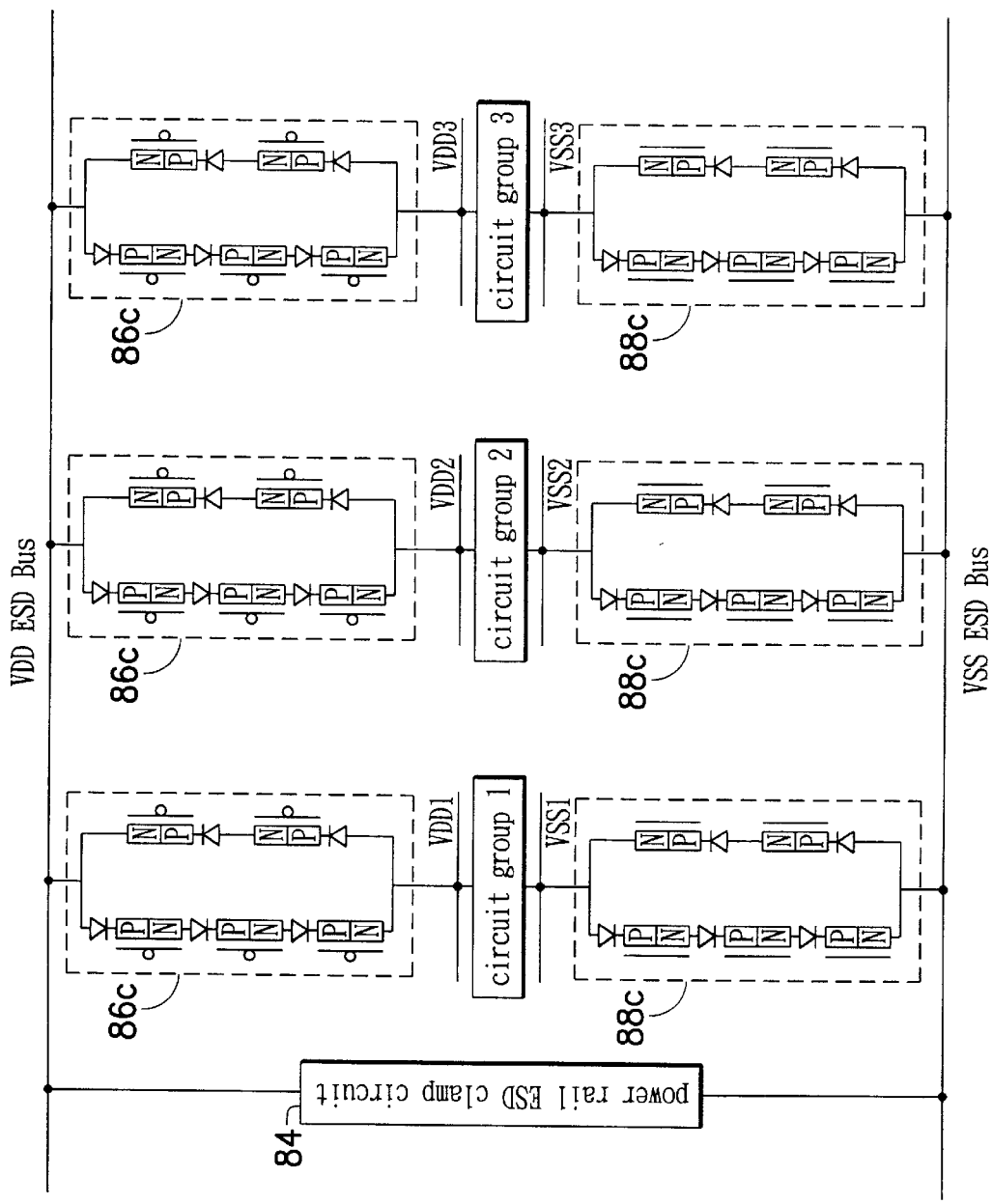
Figure 19A:
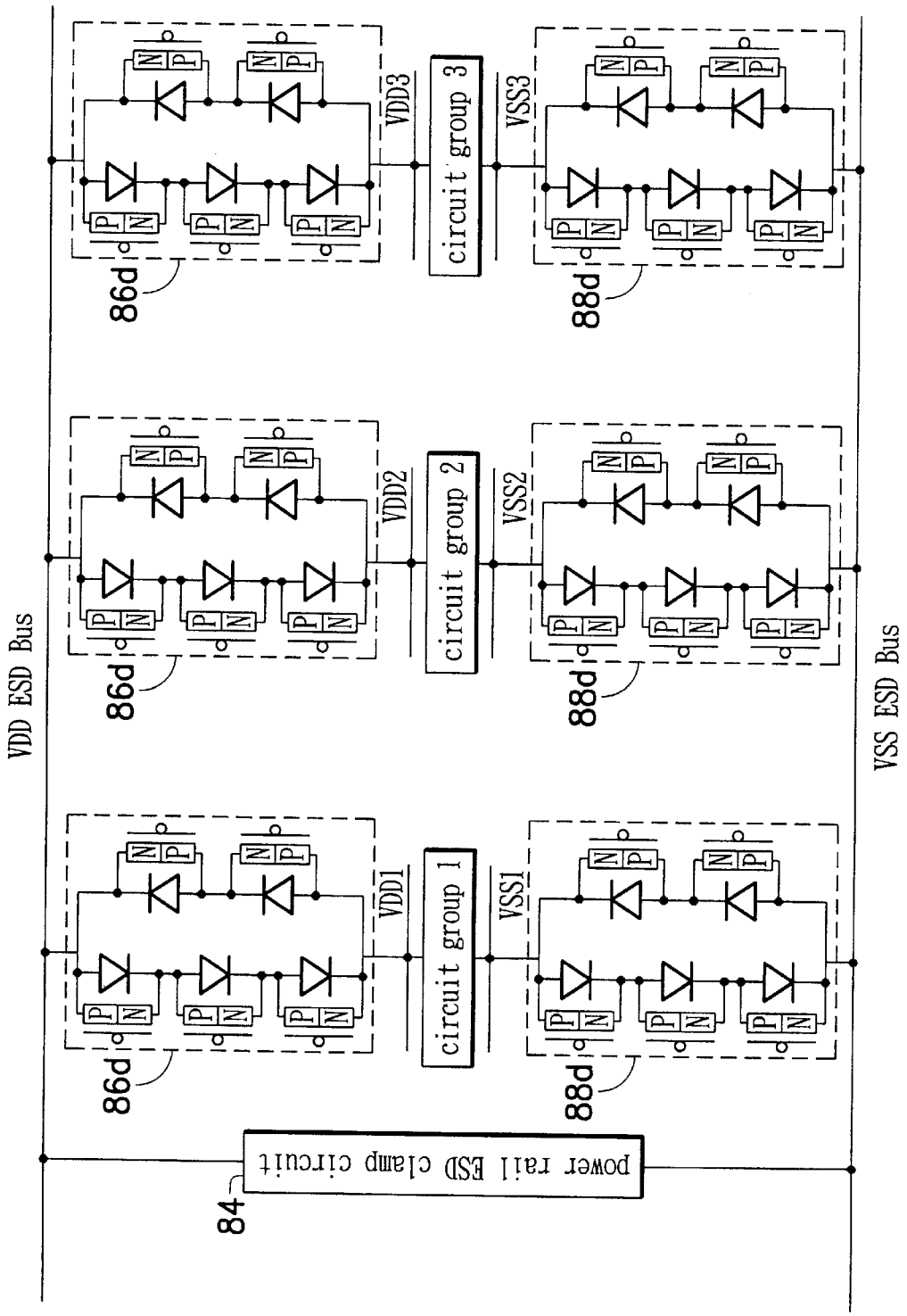
Figure 19B:
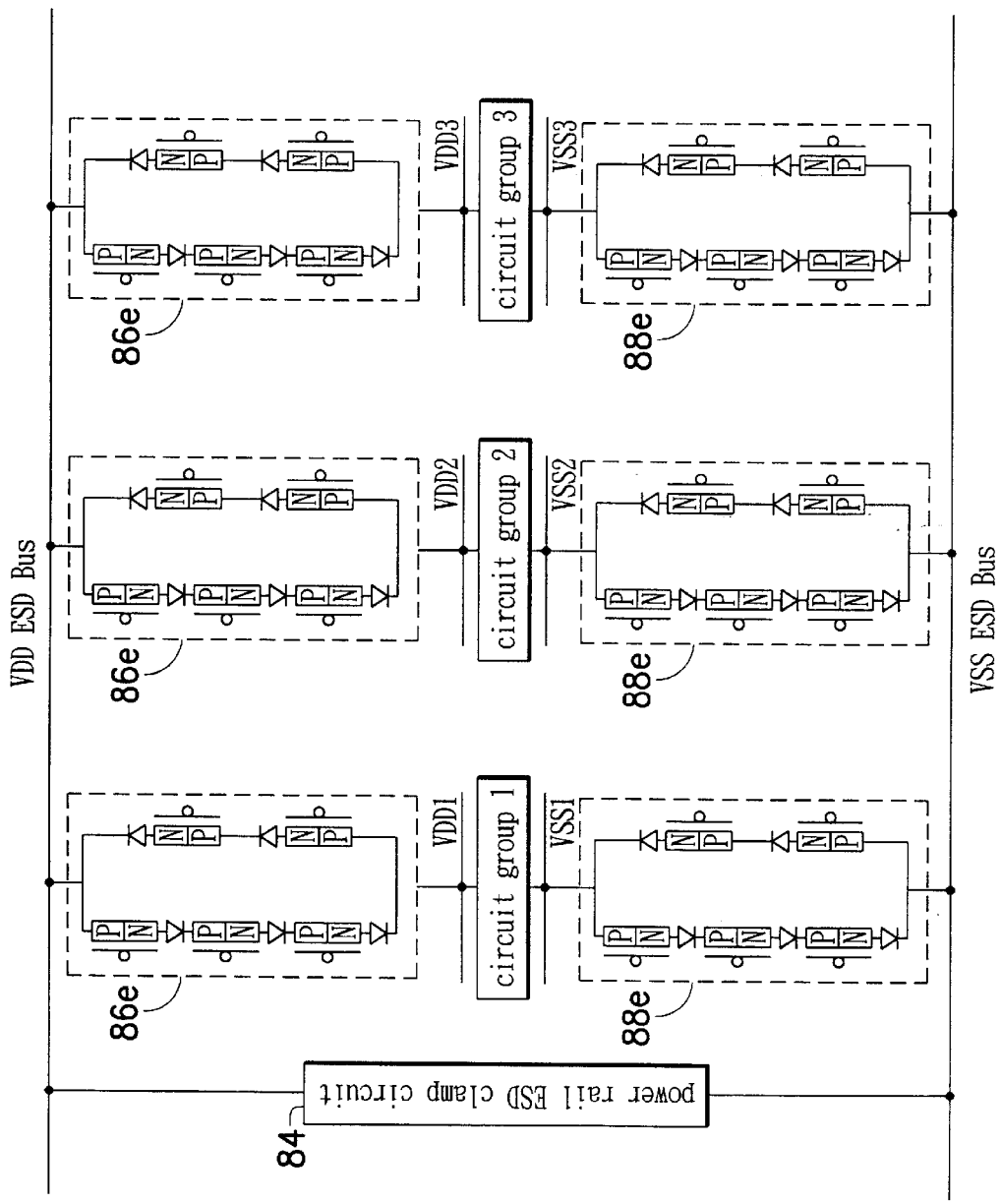
Figure 19C:
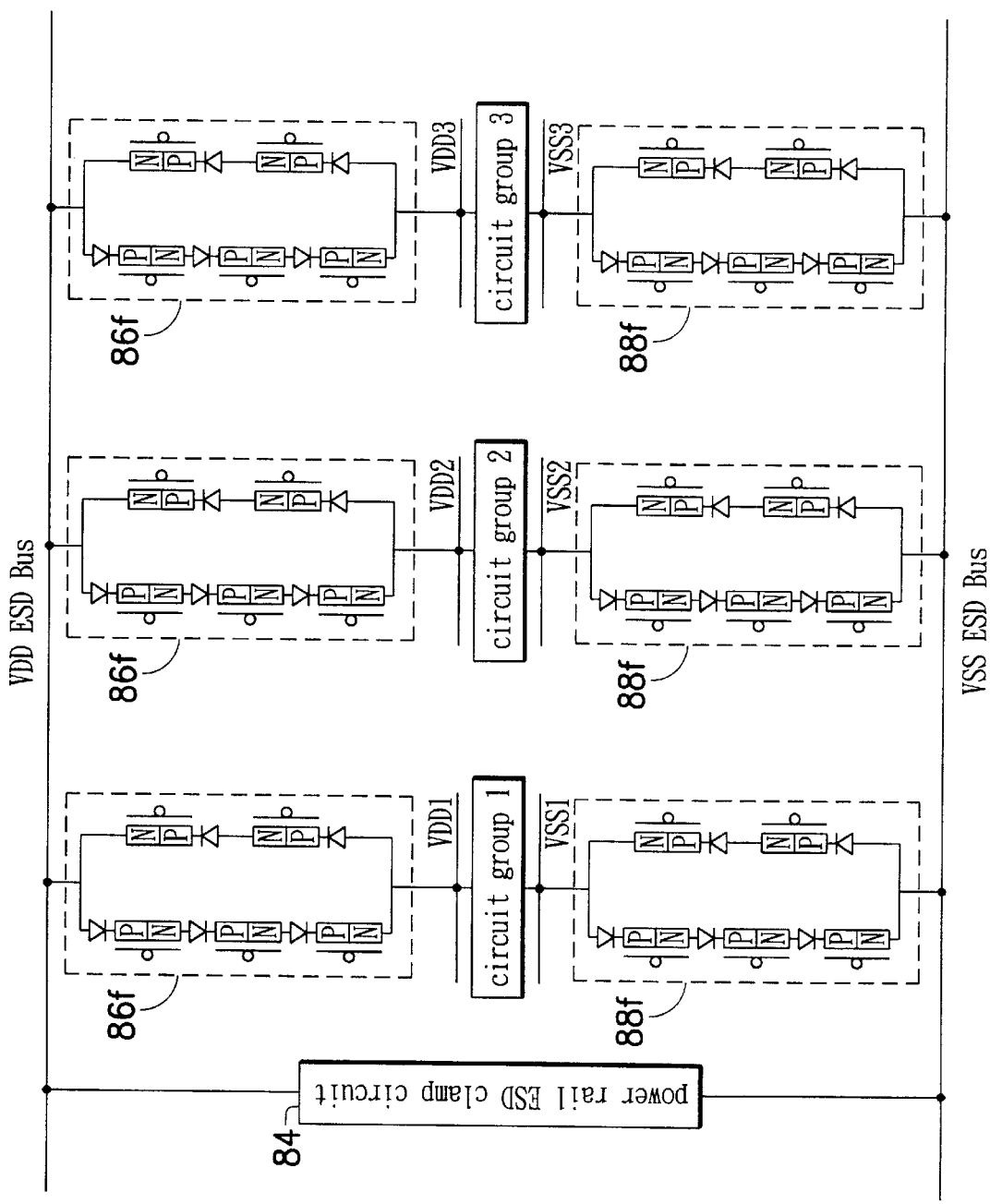

For ICs with more complicated power line distributions, more complex whole-chip ESD protection designs are needed. A number of alternative whole-chip ESD protection designs are shown in FIGS. 18a–18c and FIGS. 19a–19c. The ESD-connection cells realized by the hybrid diodes of the present invention are used to connect the separated power lines to a common VDD or VSS ESD bus line. The common VDD ESD bus line and the common VSS ESD bus line are wide metal lines that surround the chip to provide ESD current paths between different circuit groups. A power-rail ESD clamp circuit 84 is located between the common VDD ESD bus line and the common VSS ESD bus line. A high voltage ESD-connection cell 86a is coupled between each separated VDD power line (VDD1–VDD3) and the common VDD ESD bus line. A low voltage ESD-connection cell 88a is coupled between each separated VSS power line (VSS1–VSS3) and the common VSS ESD bus line. As shown in FIG. 18a, the parallel P-type and N-type hybrid diodes of the present invention are respectively used as the ESD-connection components in the high voltage ESD-connection cells 86a and the low voltage ESD-connection cells 88a. The ESD-connection components are replaced with the series P-type or N-type hybrid diodes in the high voltage ESD-connection cells and the low voltage ESD-connection cells in FIGS. 19a–19c. Each of the ESD-connection cells can also be realized by a combination of P-type or N-type hybrid diodes.

The power-rail ESD clamp circuits 92~ or 84 in FIGS. 16a–19c can be realized by any one of the power-rail ESD clamp circuits in FIGS. 12a–15c.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A hybrid diode comprising:
   a first semiconductor layer;
   a gate structure, formed on the first semiconductor layer with a second semiconductor layer stacked on an isolating layer;
   a first N-type diffusion region, formed on the first semiconductor layer adjacent to the gate structure;
   a second N-type diffusion region, formed on the second semiconductor layer, wherein the first and the second N-type diffusion regions belong to a first common region implanted during N-type implantation;
   a first P-type diffusion region, formed on the first semiconductor layer adjacent to the gate structure;
   a second P-type diffusion region, formed on the second semiconductor layer, wherein the first and the second P-type diffusion regions belong to a second common region implanted during P-type implantation; and
   an inter-connection;
   wherein the first N-type diffusion region and the first P-type diffusion region are respectively the cathode and anode of a first diode;
   the second N-type diffusion region and the second P-type diffusion region are respectively the cathode and anode of a second diode; and
   the inter-connection connects the first and second diodes in parallel or in series to form the hybrid diode.

2. The hybrid diode in claim 1, wherein the first semiconductor layer is an N-well.

3. The hybrid diode in claim 2, wherein the N-well is formed on a P-substrate.

4. The hybrid diode in claim 1, wherein the first semiconductor layer is a P-well.

5. The hybrid diode in claim 1, wherein the isolating layer is a gate oxide layer.

6. The hybrid diode in claim 1, wherein the isolating layer is a field oxide layer.

7. The hybrid diode in claim 1, wherein the gate structure surrounds the first P-type diffusion region.

8. The hybrid diode in claim 1, wherein the gate structure surrounds the first N-type diffusion region.

9. An electrostatic discharge (ESD) protection circuit, suitable for use in an integrated circuit (IC), comprising at least one hybrid diode comprising:
   a first semiconductor layer;
   a gate structure, formed on the first semiconductor layer with a second semiconductor layer stacked on an isolating layer;
   a first N-type diffusion region, formed on the first semiconductor layer adjacent to the gate structure;
   a second N-type diffusion region, formed on the second semiconductor layer, wherein the first and the second N-type diffusion regions belong to a first common region implanted during N-type implantation;
   a first P-type diffusion region, formed on the first semiconductor layer adjacent to the gate structure;
   a second P-type diffusion region, formed on the second semiconductor layer, wherein the first and the second P-type diffusion regions belong to a second common region implanted during P-type implantation; and
   an inter-connection;
   wherein the first N-type diffusion region and the first P-type diffusion region are respectively the cathode and anode of a first diode;
   the second N-type diffusion region and the second P-type diffusion region are respectively the cathode and anode of a second diode; and
   the inter-connection connects the first and second diodes in parallel or in series to form the hybrid diode;
   wherein the anode of the hybrid diode is coupled to a first pad, and the cathode of the hybrid diode is coupled to a second pad.

10. The ESD protection circuit in claim 9, wherein one of the first and the second pads is a power line, and the other is an I/O pad.

11. The ESD protection circuit in claim 9, wherein both the first and the second pads are power lines.

12. The ESD protection circuit in claim 11, wherein during normal operation, the two power lines are powered to forward bias the hybrid diode.

13. The ESD protection circuit in claim 11, wherein during normal conditions, the two power lines are powered to reverse bias the diode.

14. The ESD protection circuit in claim 13, wherein the ESD protection circuit comprises a plurality of hybrid diodes connected in series, with a primary anode and a primary cathode respectively coupled to the two power lines.

15. The ESD protection circuit in claim 11, wherein during normal operation, the two power lines are applied with the same voltage.

16. The ESD protection circuit in claim 15, wherein the ESD protection circuit comprises a plurality of hybrid diodes connected in series, with a primary anode and a primary cathode respectively coupled to the two power lines.

17. The ESD protection circuit in claim 15, wherein the two power lines are respectively a first power line and a second power line, the IC further comprises a third power line applied with a voltage different from that for the first power line during normal conditions, and the ESD protection circuit further comprises a power-rail ESD clamp circuit coupled between the first and the third power lines to clamp the voltage across the first and the third power lines.

18. An electrostatic discharge (ESD) protection system, suitable for an integrated circuit (IC), the ESD protection system comprising:
   a relatively high voltage ESD bus;
   a relatively low voltage ESD bus;
   a power rail ESD clamp bus, coupled between the relatively high voltage ESD bus and the relatively low voltage ESD bus;
   a high voltage ESD-connection cell, coupled between the relatively high voltage ESD bus and a high voltage power line;
   a low voltage ESD-connection cell, coupled between the relatively low voltage ESD bus and a low voltage power line; and
   a hybrid diode, formed in at least one of the high and low ESD connection cells, comprising:
      a first semiconductor layer;
      a gate structure, formed on the first semiconductor layer with a second semiconductor layer stacked on an isolating layer;
      a first N-type diffusion region, formed on the first semiconductor layer adjacent to the gate structure;
      a second N-type diffusion region, formed on the second semiconductor layer, the first and the second N-type diffusion regions are formed with the same N-type implantation;
      a first P-type diffusion region, formed on the first semiconductor layer adjacent to the gate structure;
      a second P-type diffusion region, formed on the second semiconductor layer, the first and the second P-type diffusion regions are formed with the same P-type implantation; and
      an inter-connection;
      wherein the first N-type diffusion region and the first P-type diffusion region are respectively the cathode and anode of a first diode;
      the second N-type diffusion region and the second P-type diffusion region are respectively the cathode and anode of a second d diode; and
      the inter-connection connects the first and second diodes in parallel or in series to form the hybrid diode.

19. The ESD protection circuit in claim 18, wherein the ESD protection circuit comprises:
   a plurality of relatively high voltage ESD-connection cells, respectively coupled between the relatively high voltage ESD bus and a plurality of high voltage power lines; and
   a plurality of relatively low voltage ESD-connection cells, respectively coupled between the relatively low voltage ESD bus and a plurality of low voltage power lines;
   wherein the hybrid diode is formed in at least one of the high voltage ESD-connection cells and the low voltage ESD-connection cells.

* * * * *